(12) United States Patent
Tanaka et al.

(10) Patent No.: US 8,110,865 B2
(45) Date of Patent: Feb. 7, 2012

(54) SEMICONDUCTOR DEVICE AND METHOD FOR MANUFACTURING THE SAME

(75) Inventors: Masayuki Tanaka, Yokohama (JP); Daisuke Nishida, Yokohama (JP); Ryota Fujitsuka, Yokohama (JP); Katsuyuki Sekine, Yokohama (JP); Akihito Yamamoto, Naka-gun (JP); Katsuaki Natori, Yokohama (JP); Yoshio Ozawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/888,140

(22) Filed: Sep. 22, 2010

(65) Prior Publication Data

US 2011/0012190 A1 Jan. 20, 2011

Related U.S. Application Data

(62) Division of application No. 11/783,952, filed on Apr. 13, 2007, now abandoned.

(30) Foreign Application Priority Data

Apr. 14, 2006 (JP) ................................. 2006-112192
Feb. 16, 2007 (JP) ................................. 2007-037153

(51) Int. Cl.
*H01L 29/788* (2006.01)
(52) U.S. Cl. ................................. 257/316; 257/E27.078
(58) Field of Classification Search .......... 257/316–321, 257/E27.078
See application file for complete search history.

(56) References Cited

U.S. PATENT DOCUMENTS

| 6,214,697 | B1 * | 4/2001 | Moore et al. .................. 438/424 |
| 6,803,272 | B1 | 10/2004 | Halliyal et al. |
| 2005/0280069 | A1 | 12/2005 | Mizushima et al. |
| 2006/0057794 | A1 | 3/2006 | Youn et al. |
| 2006/0240619 | A1 | 10/2006 | Ozawa et al. |
| 2009/0302433 | A1 * | 12/2009 | Yamazaki et al. ............ 257/632 |

FOREIGN PATENT DOCUMENTS

| JP | 5-129625 | 5/1993 |
| JP | 2006-86525 | 3/2006 |
| KR | 2002-0032760 | 5/2002 |
| KR | 10-2006-0025326 | 3/2006 |

OTHER PUBLICATIONS

Notification for Filing Opinion issued by the Korean Patent Office on Feb. 20, 2008, for Korean Patent Application No. 10-2007-35569, and Engligh-language translation thereof.
Notification for Filing Opinion mailed Aug. 20, 2008, from the Korean Patent Office in counterpart Korean Application No. 10-2007-35569 with English Translation.

* cited by examiner

*Primary Examiner* — Richard A. Booth
(74) *Attorney, Agent, or Firm* — Finnegan, Henderson, Farabow, Garrett & Dunner, L.L.P.

(57) ABSTRACT

A semiconductor device includes a semiconductor substrate, a first insulating film formed on the semiconductor substrate, a charge storage layer formed on the first insulating film, a second insulating film formed on the charge storage layer, and a control electrode formed on the second insulating film, the second insulating film including a lower silicon nitride film, a lower silicon oxide film formed on the lower silicon nitride film, an intermediate insulating film formed on the lower silicon oxide film and containing a metal element, the intermediate insulating film having a relative dielectric constant of greater than 7, an upper silicon oxide film formed on the intermediate insulating film, and an upper silicon nitride film formed on the upper silicon oxide film.

5 Claims, 20 Drawing Sheets

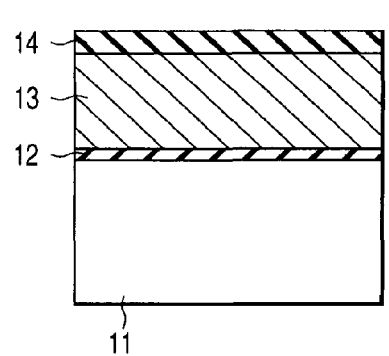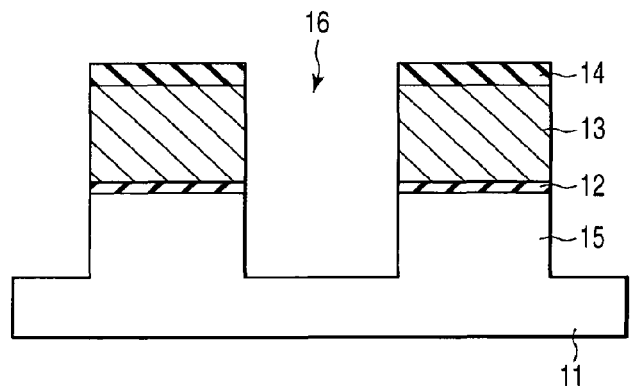
FIG.1A    FIG.1B
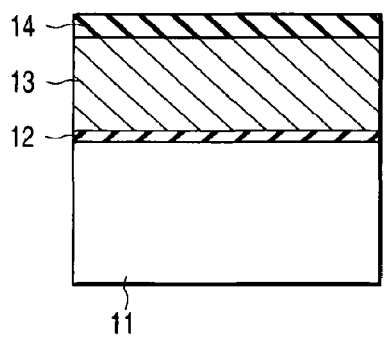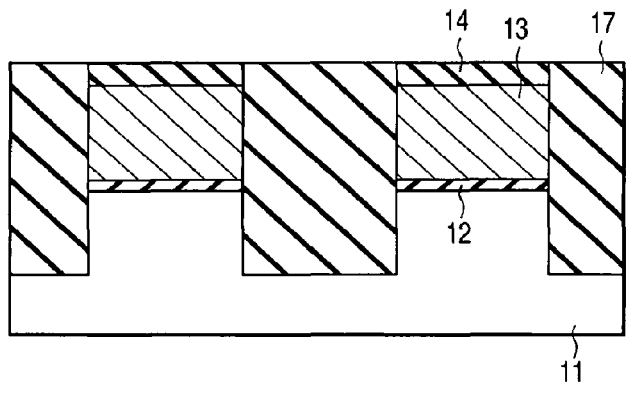
FIG.2A    FIG.2B

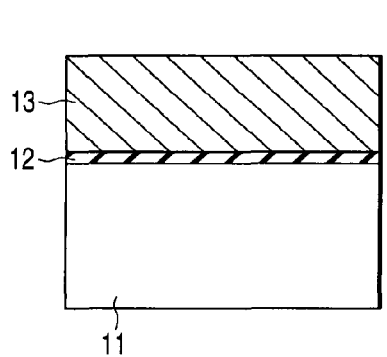
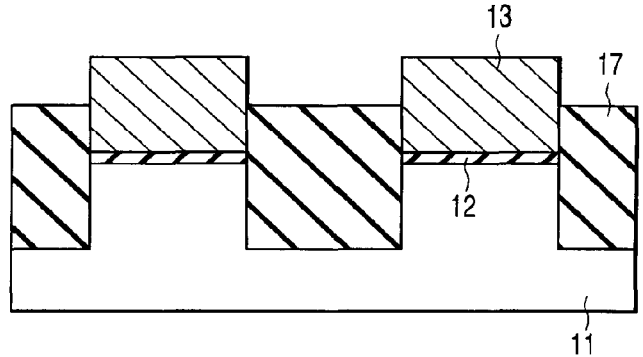
FIG. 3A     FIG. 3B
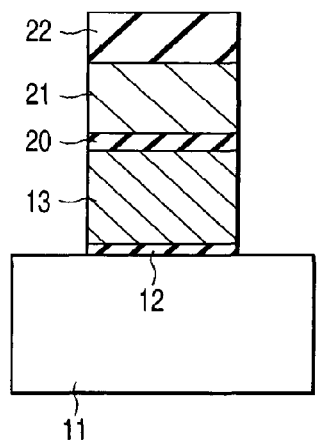
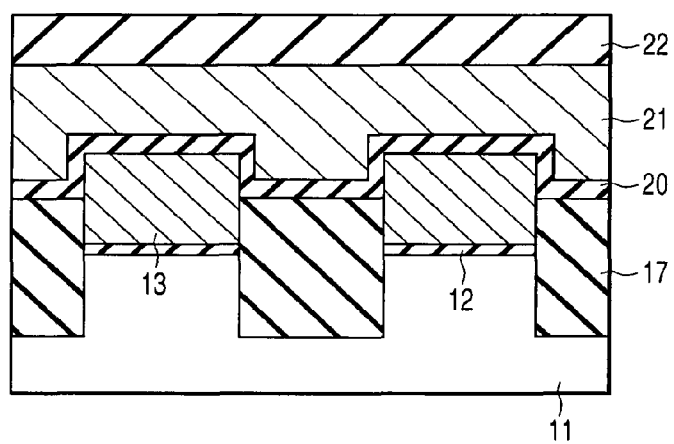
FIG. 4A     FIG. 4B

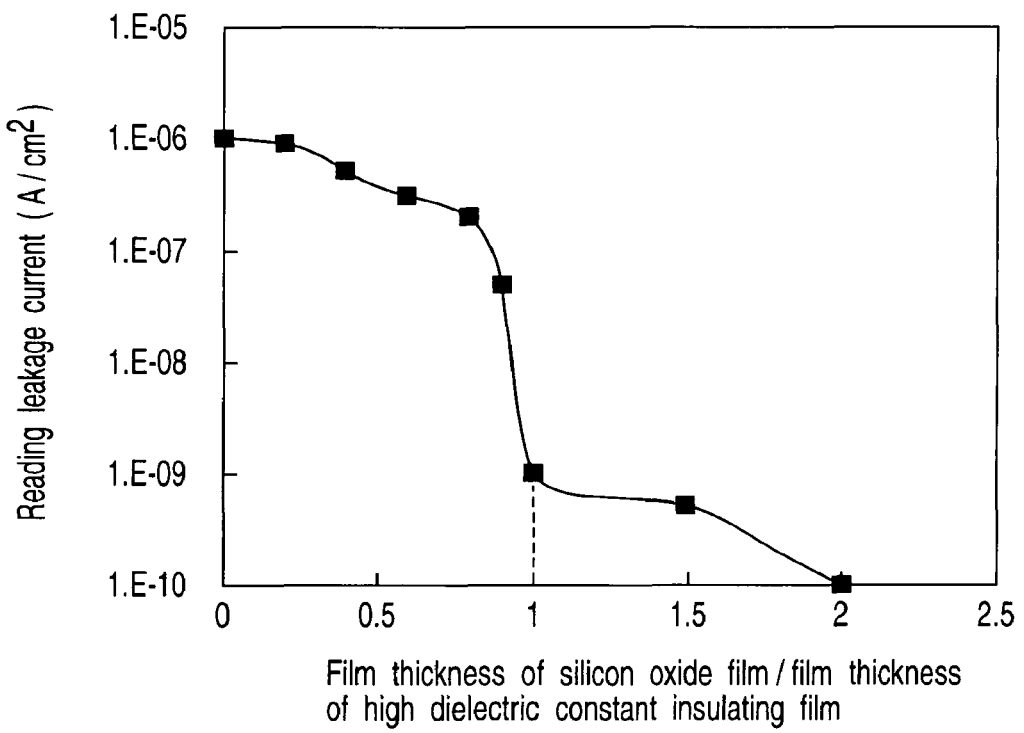
F I G. 7
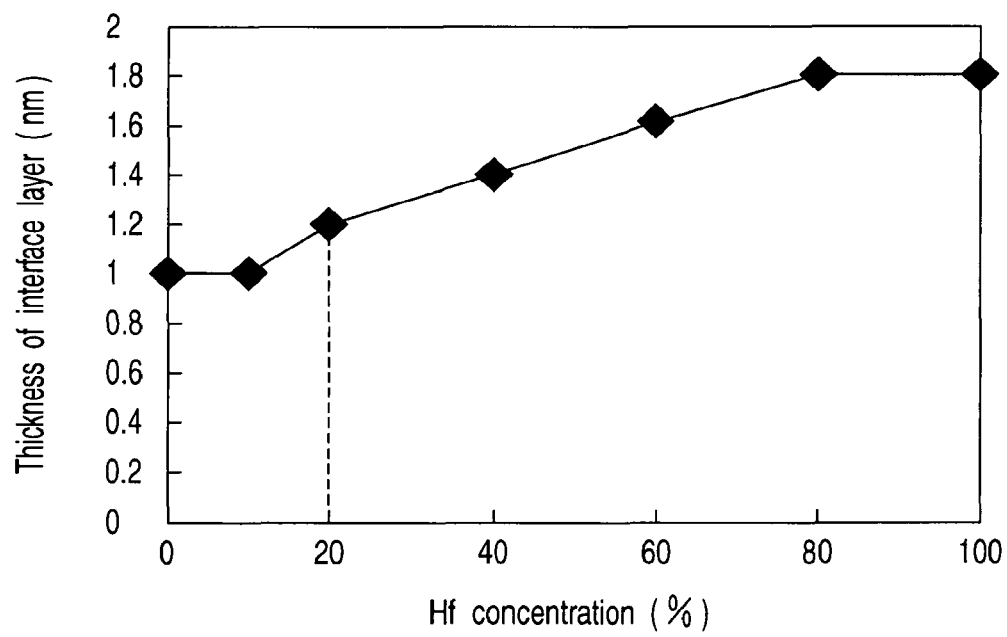
F I G. 8

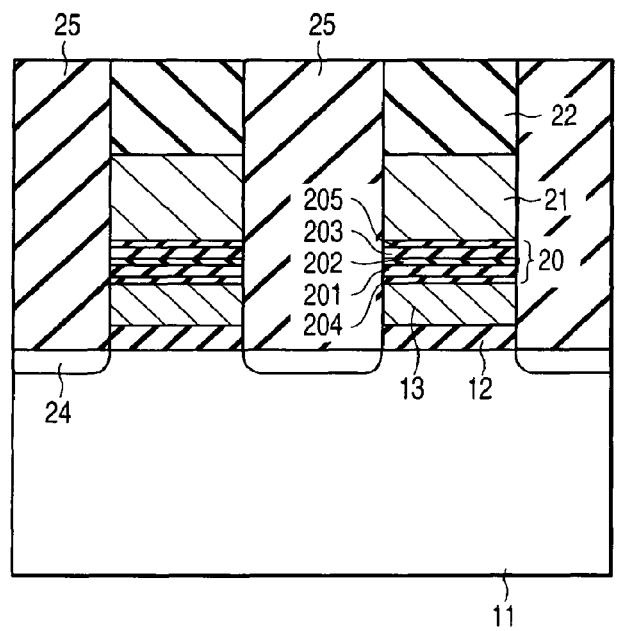
F I G. 1 5
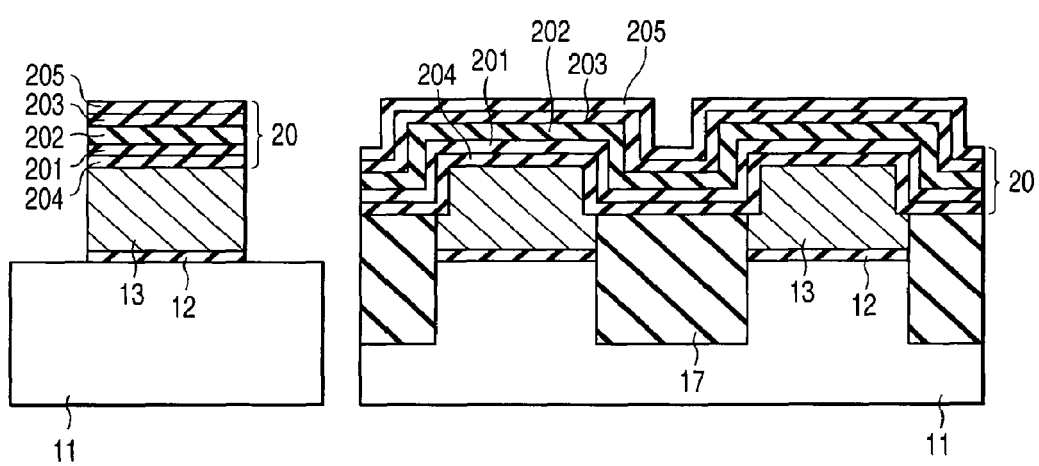
F I G. 1 6 A  F I G. 1 6 B

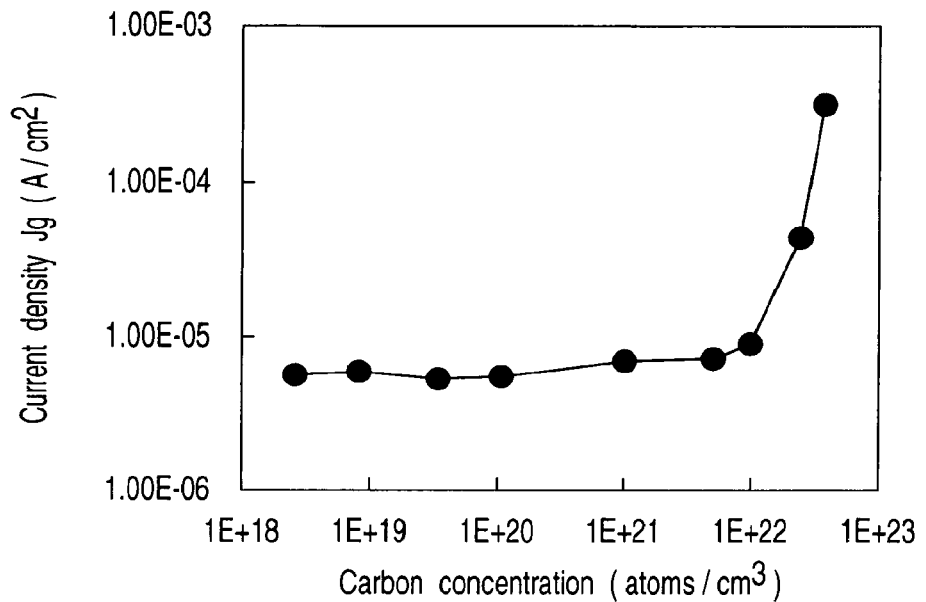
F I G. 1 7
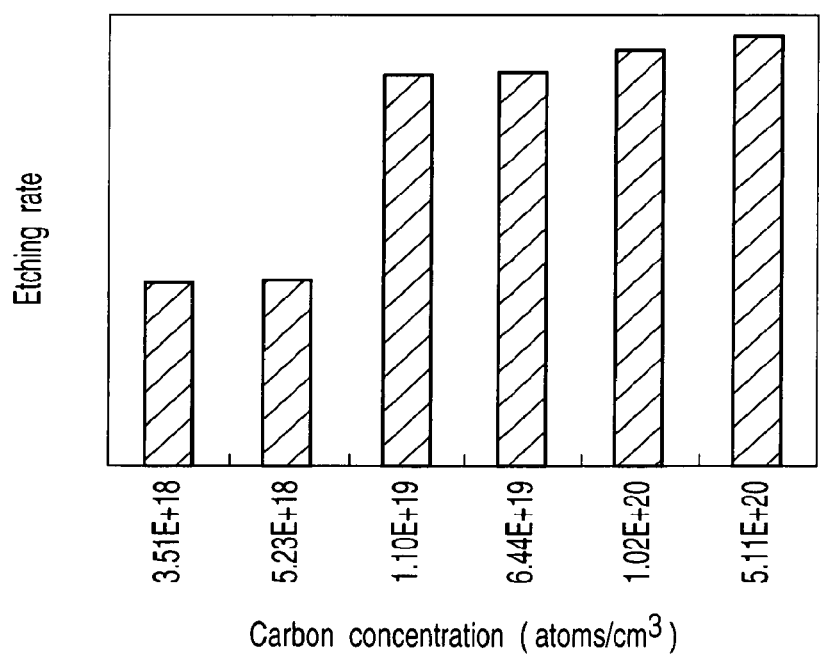
F I G. 1 8

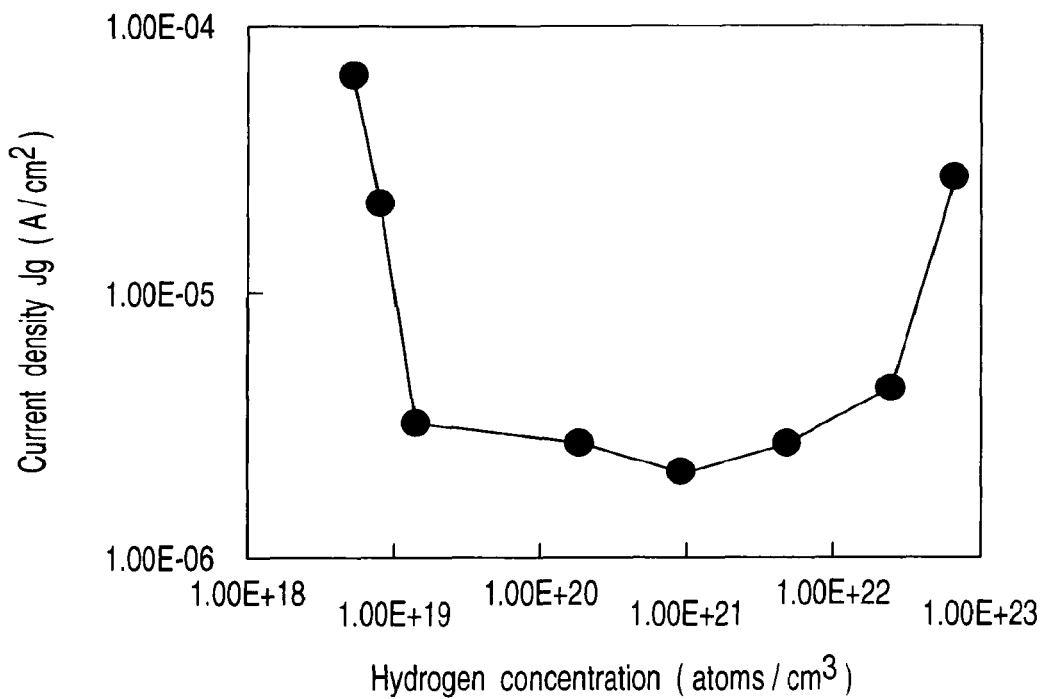
F I G. 2 1
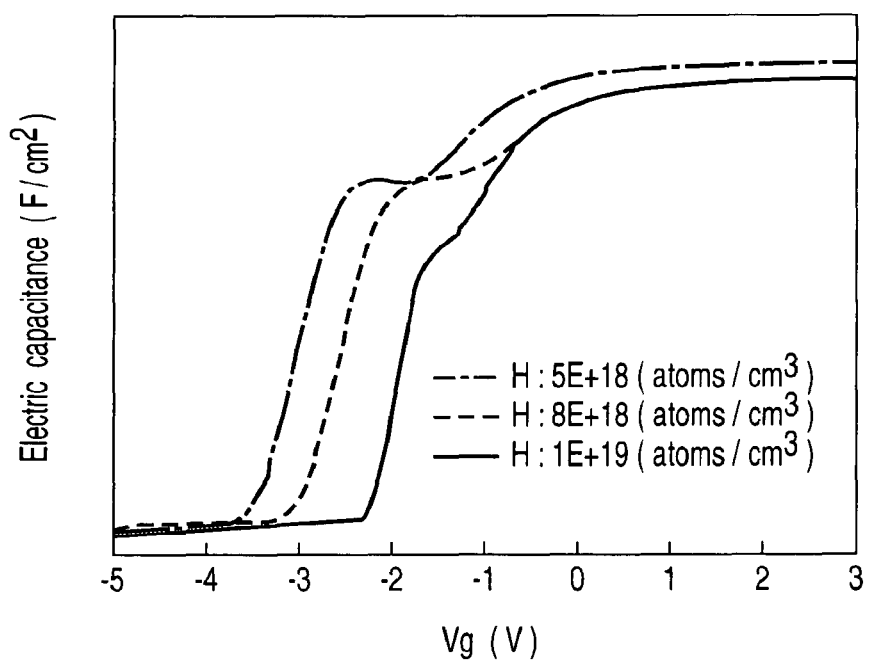
F I G. 2 2

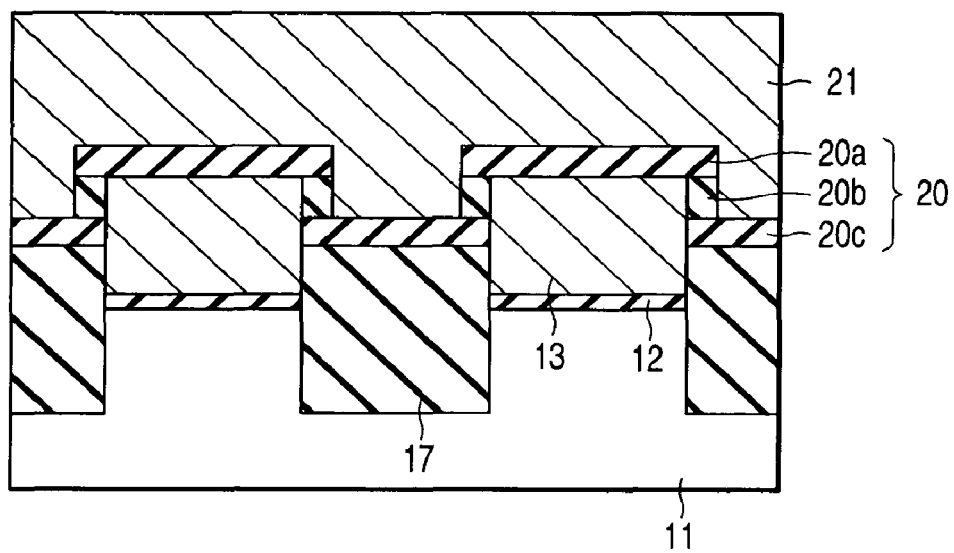
F I G. 2 3
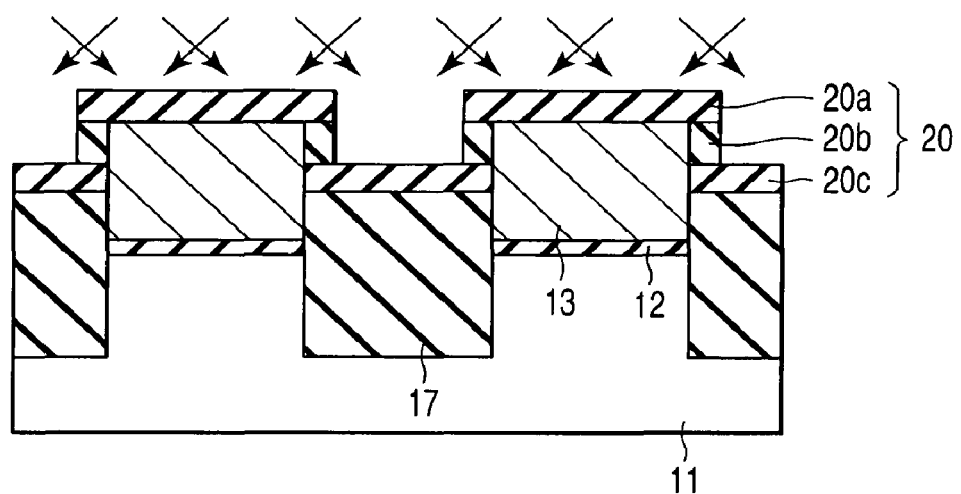
F I G. 2 4

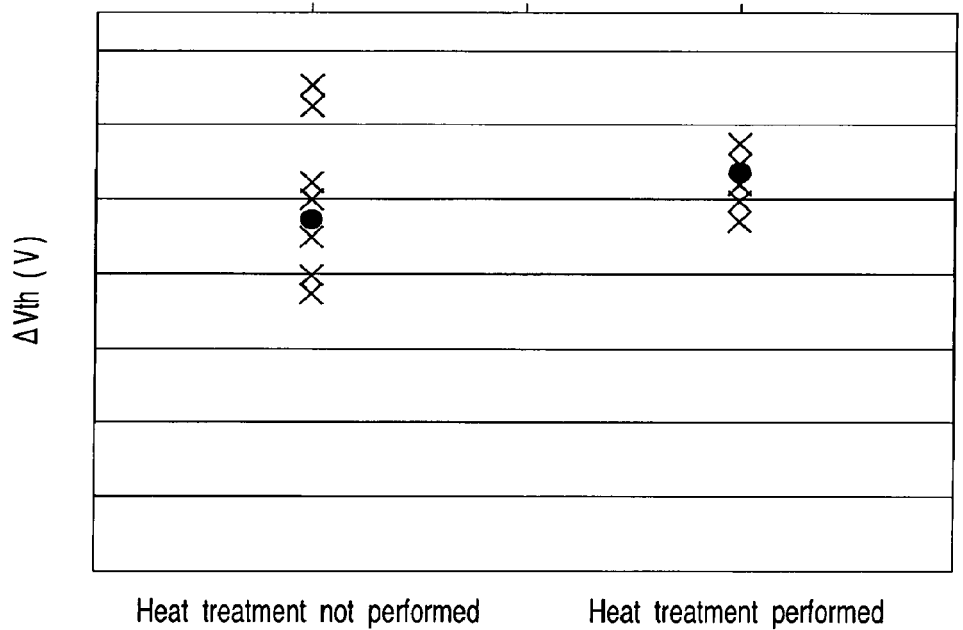
F I G. 3 2
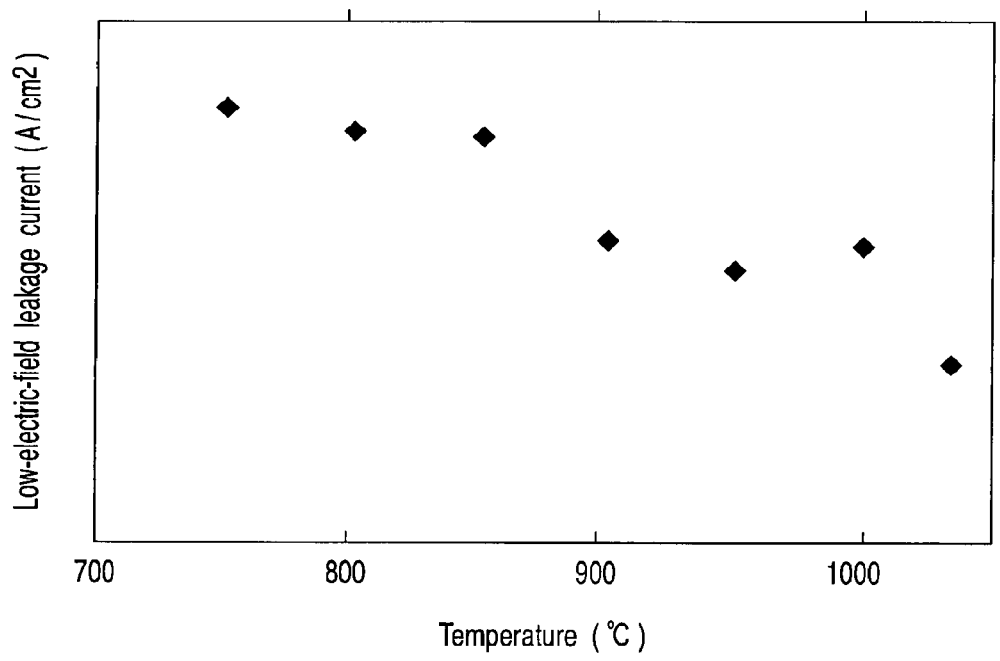
F I G. 3 3

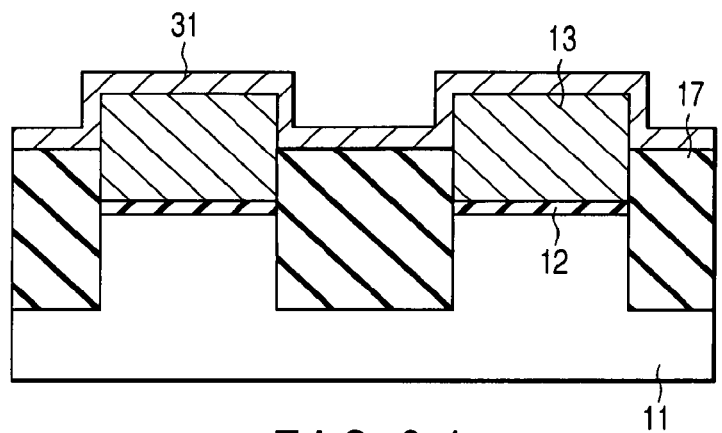
F I G. 3 4
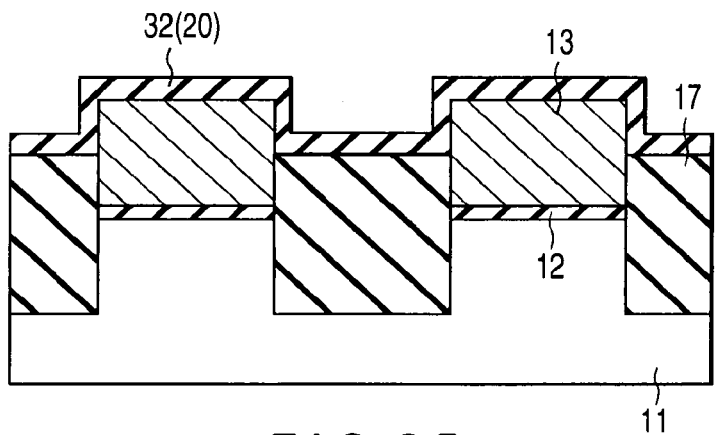
F I G. 3 5
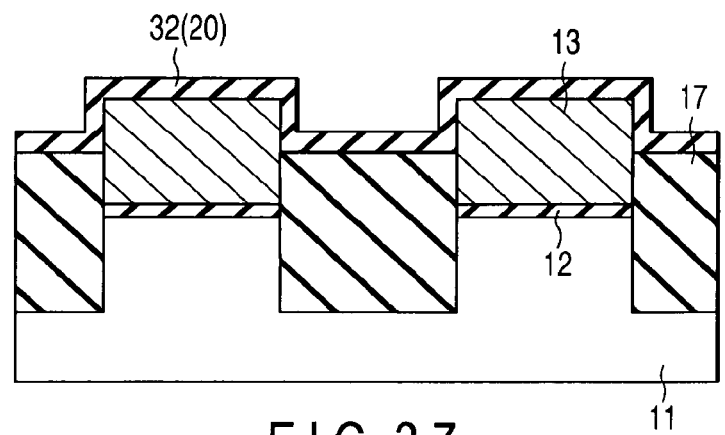
F I G. 3 7

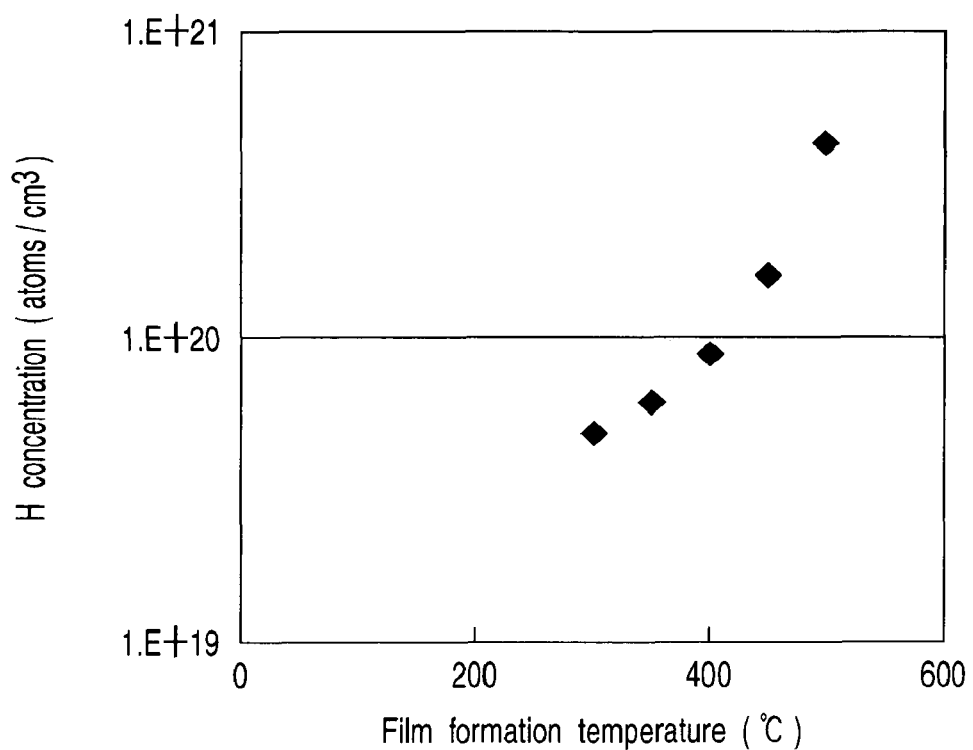
F I G. 3 8
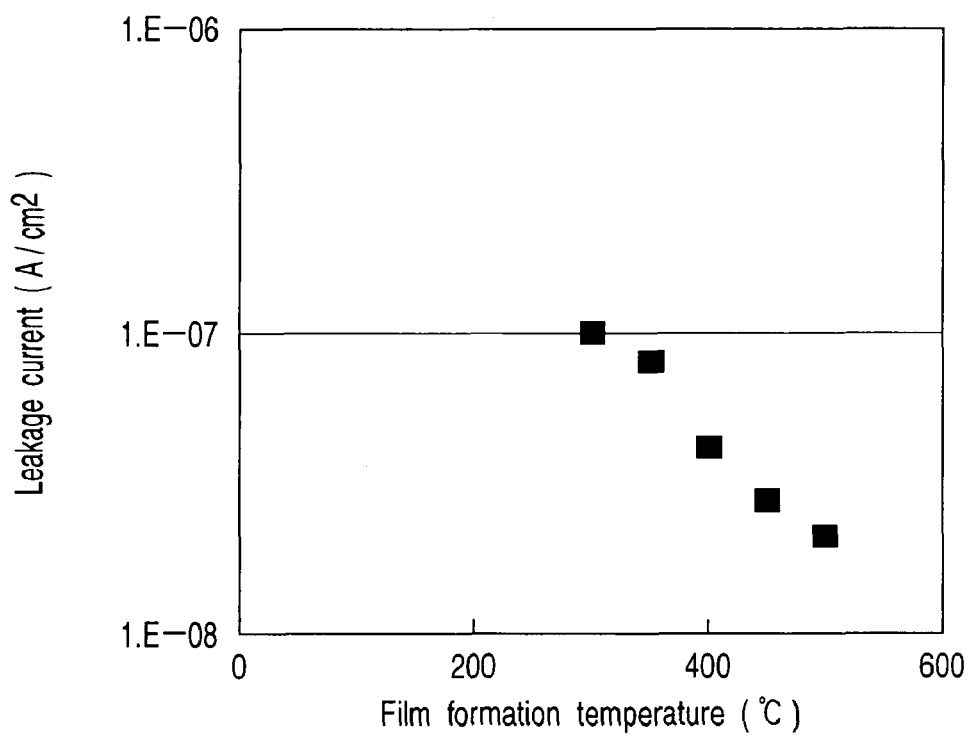
F I G. 3 9

SEMICONDUCTOR DEVICE AND METHOD FOR MANUFACTURING THE SAME

CROSS-REFERENCE TO RELATED APPLICATIONS

This application is a divisional of application Ser. No. 11/783,952, filed April 13, 2007 now abandoned, and is based upon and claims the benefit of priority from the prior Japanese Patent Application No. 2006-112192, filed Apr. 14, 2006; and No. 2007-037153, filed Feb. 16, 2007, the entire contents of all of which are incorporated herein by reference.

BACKGROUND OF THE INVENTION

1. Field of the Invention

The present invention relates to a semiconductor device and a method for manufacturing the semiconductor device.

2. Description of the Related Art

For nonvolatile semiconductor memory devices, a proposal has been made that a high dielectric constant insulating film be provided between a control electrode and a charge storage layer in order to increase the capacitance between the control electrode and the charge storage layer (see, for example, Jpn. Pat. Appln. KOKAI Publication No. 5-129625).

However, sufficient examinations have not been made for the insulating film provided between the control electrode and the charge storage layer. It has thus been difficult to obtain a nonvolatile semiconductor memory device offering excellent characteristics and improved reliability.

BRIEF SUMMARY OF THE INVENTION

A semiconductor device in accordance with a first aspect of the present invention comprises: a semiconductor substrate; a first insulating film formed on the semiconductor substrate; a charge storage layer formed on the first insulating film; a second insulating film formed on the charge storage layer; and a control electrode formed on the second insulating film, the second insulating film including a lower silicon nitride film, a lower silicon oxide film formed on the lower silicon nitride film, an intermediate insulating film formed on the lower silicon oxide film and containing a metal element, the intermediate insulating film having a relative dielectric constant of greater than 7, an upper silicon oxide film formed on the intermediate insulating film, and an upper silicon nitride film formed on the upper silicon oxide film.

A semiconductor device in accordance with a second aspect of the present invention comprises: a semiconductor substrate; a first insulating film formed on the semiconductor substrate; a charge storage layer formed on the first insulating film; a second insulating film formed on the charge storage layer; and a control electrode formed on the second insulating film, the second insulating film having one of a first film structure, a second film structure, and a third film structure, the first film structure including a lower silicon oxide film, an intermediate insulating film formed on the lower silicon oxide film and containing a metal element, the intermediate insulating film having a relative dielectric constant of greater than 7, and an upper silicon oxide film formed on the intermediate insulating film, the second film structure including a lower silicon nitride film, a lower silicon oxide film formed on the lower silicon nitride film, an intermediate insulating film formed on the lower silicon oxide film and containing a metal element, the intermediate insulating film having a relative dielectric constant of greater than 7, and an upper silicon oxide film formed on the intermediate insulating film, and an upper silicon nitride film formed on the upper silicon oxide film, the third film structure including a lower silicon nitride film, an intermediate insulating film formed on the lower silicon nitride film and containing a metal element, the intermediate insulating film having a relative dielectric constant of greater than 7, and an upper silicon nitride film formed on the intermediate insulating film, the intermediate insulating film having a thickness equal to or greater than that of one atomic layer and equal to or smaller than 5 nm.

A semiconductor device in accordance with a third aspect of the present invention comprises: a semiconductor substrate; a first insulating film formed on the semiconductor substrate; a charge storage layer formed on the first insulating film; a second insulating film formed on the charge storage layer; and a control electrode formed on the second insulating film, the second insulating film having one of a first film structure and a second film structure, the first film structure including a lower silicon oxide film, an intermediate insulating film formed on the lower silicon oxide film and containing a metal element, the intermediate insulating film having a relative dielectric constant of greater than 7, and an upper silicon oxide film formed on the intermediate insulating film, the second film structure including a lower silicon nitride film, a lower silicon oxide film formed on the lower silicon nitride film, an intermediate insulating film formed on the lower silicon oxide film and containing a metal element, the intermediate insulating film having a relative dielectric constant of greater than 7, an upper silicon oxide film formed on the intermediate insulating film, and an upper silicon nitride film formed on the upper silicon oxide film, the intermediate insulating film being formed of a polycrystalline film, and crystal grains contained in the polycrystalline film having an average grain size of at least 5 nm.

A semiconductor device in accordance with a fourth aspect of the present invention comprises: a semiconductor substrate; a first insulating film formed on the semiconductor substrate; a charge storage layer formed on the first insulating film; a second insulating film formed on the charge storage layer; and a control electrode formed on the second insulating film, the second insulating film having one of a first film structure, a second film structure, and a third film structure, the first film structure including a lower silicon oxide film, an intermediate insulating film formed on the lower silicon oxide film and containing a metal element, the intermediate insulating film having a relative dielectric constant of greater than 7, and an upper silicon oxide film formed on the intermediate insulating film, the second film structure including a lower silicon nitride film, a lower silicon oxide film formed on the lower silicon nitride film, an intermediate insulating film formed on the lower silicon oxide film and containing a metal element, the intermediate insulating film having a relative dielectric constant of greater than 7, an upper silicon oxide film formed on the intermediate insulating film, and an upper silicon nitride film formed on the upper silicon oxide film, the third film structure including a lower silicon nitride film, an intermediate insulating film formed on the lower silicon nitride film and containing a metal element, the intermediate insulating film having a relative dielectric constant of greater than 7, and an upper silicon nitride film formed on the intermediate insulating film, wherein the following expression is satisfied, $T/(T+M+S) \geqq 0.2$, where T ($T>0$) is a concentration of a transition metal element in the intermediate insulating film, M ($M \geqq 0$) is a concentration of a metal element other than the transition metal element in the intermediate insulating film, and S ($S \geqq 0$) is a concentration of a semiconductor element in the intermediate insulating film.

A semiconductor device in accordance with a fifth aspect of the present invention comprises: a semiconductor substrate; a first insulating film formed on the semiconductor substrate; a charge storage layer formed on the first insulating film; a second insulating film formed on the charge storage layer; and a control electrode formed on the second insulating film, the second insulating film having one of a first film structure, a second film structure, and a third film structure, the first film structure including a lower silicon oxide film, an intermediate insulating film formed on the lower silicon oxide film and containing a metal element, the intermediate insulating film having a relative dielectric constant of greater than 7, and an upper silicon oxide film formed on the intermediate insulating film, the second film structure including a lower silicon nitride film, a lower silicon oxide film formed on the lower silicon nitride film, an intermediate insulating film formed on the lower silicon oxide film and containing a metal element, the intermediate insulating film having a relative dielectric constant of greater than 7, an upper silicon oxide film formed on the intermediate insulating film, and an upper silicon nitride film formed on the upper silicon oxide film, the third film structure including a lower silicon nitride film, an intermediate insulating film formed on the lower silicon nitride film and containing a metal element, the intermediate insulating film having a relative dielectric constant of greater than 7, and an upper silicon nitride film formed on the intermediate insulating film, the intermediate insulating film having a carbon concentration of at least $1\times10^{19}$ atoms/cm$^3$ and at most $2\times10^{22}$ atoms/cm$^3$.

A semiconductor device in accordance with a sixth aspect of the present invention comprises: a semiconductor substrate; a first insulating film formed on the semiconductor substrate; a charge storage layer formed on the first insulating film; a second insulating film formed on the charge storage layer; and a control electrode formed on the second insulating film, the second insulating film having one of a first film structure, a second film structure, and a third film structure, the first film structure including a lower silicon oxide film, an intermediate insulating film formed on the lower silicon oxide film and containing a metal element, the intermediate insulating film having a relative dielectric constant of greater than 7, and an upper silicon oxide film formed on the intermediate insulating film, the second film structure including a lower silicon nitride film, a lower silicon oxide film formed on the lower silicon nitride film, an intermediate insulating film formed on the lower silicon oxide film and containing a metal element, the intermediate insulating film having a relative dielectric constant of greater than 7, an upper silicon oxide film formed on the intermediate insulating film, and an upper silicon nitride film formed on the upper silicon oxide film, the third film structure including a lower silicon nitride film, an intermediate insulating film formed on the lower silicon nitride film and containing a metal element, the intermediate insulating film having a relative dielectric constant of greater than 7, and an upper silicon nitride film formed on the intermediate insulating film, the intermediate insulating film having a nitrogen concentration of at least $1\times10^{19}$ atoms/cm$^3$ and at most $2\times10^{22}$ atoms/cm$^3$.

A semiconductor device in accordance with a seventh aspect of the present invention comprises: a semiconductor substrate; a first insulating film formed on the semiconductor substrate; a charge storage layer formed on the first insulating film; a second insulating film formed on the charge storage layer; and a control electrode formed on the second insulating film, the second insulating film having one of a first film structure, a second film structure, and a third film structure, the first film structure including a lower silicon oxide film, an intermediate insulating film formed on the lower silicon oxide film and containing a metal element, the intermediate insulating film having a relative dielectric constant of greater than 7, and an upper silicon oxide film formed on the intermediate insulating film, the second film structure including a lower silicon nitride film, a lower silicon oxide film formed on the lower silicon nitride film, an intermediate insulating film formed on the lower silicon oxide film and containing a metal element, the intermediate insulating film having a relative dielectric constant of greater than 7, an upper silicon oxide film formed on the intermediate insulating film, and an upper silicon nitride film formed on the upper silicon oxide film, the third film structure including a lower silicon nitride film, an intermediate insulating film formed on the lower silicon nitride film and containing a metal element, the intermediate insulating film having a relative dielectric constant of greater than 7, and an upper silicon nitride film formed on the intermediate insulating film, the intermediate insulating film having a hydrogen concentration of at least $1\times10^{19}$ atoms/cm$^3$ and at most $5\times10^{22}$ atoms/cm$^3$.

A semiconductor device in accordance with an eighth aspect of the present invention comprises: a semiconductor substrate; a first insulating film formed on the semiconductor substrate; a charge storage layer formed on the first insulating film; a second insulating film formed on the charge storage layer; and a control electrode formed on the second insulating film, the second insulating film having one of a first film structure and a second film structure, the first film structure including a lower silicon oxide film, an intermediate insulating film formed on the lower silicon oxide film and containing a metal element, the intermediate insulating film having a relative dielectric constant of greater than 7, and an upper silicon oxide film formed on the intermediate insulating film, the second film structure including a lower silicon nitride film, a lower silicon oxide film formed on the lower silicon nitride film, an intermediate insulating film formed on the lower silicon oxide film and containing a metal element, the intermediate insulating film having a relative dielectric constant of greater than 7, an upper silicon oxide film formed on the intermediate insulating film, and an upper silicon nitride film formed on the upper silicon oxide film, at least one of the lower silicon oxide film and the upper silicon oxide film being thicker than the intermediate insulating film.

A semiconductor device in accordance with a ninth aspect of the present invention comprises: a semiconductor substrate; a first insulating film formed on the semiconductor substrate; a charge storage layer formed on the first insulating film; a second insulating film formed on the charge storage layer; and a control electrode formed on the second insulating film, the second insulating film having one of a first film structure and a second film structure, the first film structure including a lower silicon oxide film, an intermediate insulating film formed on the lower silicon oxide film and containing a metal element, the intermediate insulating film having a relative dielectric constant of greater than 7, and an upper silicon oxide film formed on the intermediate insulating film, the second film structure including a lower silicon nitride film, a lower silicon oxide film formed on the lower silicon nitride film, an intermediate insulating film formed on the lower silicon oxide film and containing a metal element, the intermediate insulating film having a relative dielectric constant of greater than 7, an upper silicon oxide film formed on the intermediate insulating film, and an upper silicon nitride film formed on the upper silicon oxide film, at least one of the lower silicon oxide film and the upper silicon oxide film having a carbon concentration of at least $1\times10^{19}$ atoms/cm$^3$.

A semiconductor device in accordance with a tenth aspect of the present invention comprises: a semiconductor substrate; a first insulating film formed on the semiconductor substrate; a charge storage layer formed on the first insulating film; a second insulating film formed on the charge storage layer; and a control electrode formed on the second insulating film, the second insulating film having one of a first film structure and a second film structure, the first film structure including a lower silicon oxide film, an intermediate insulating film formed on the lower silicon oxide film and containing a metal element, the intermediate insulating film having a relative dielectric constant of greater than 7, and an upper silicon oxide film formed on the intermediate insulating film, the second film structure including a lower silicon nitride film, a lower silicon oxide film formed on the lower silicon nitride film, an intermediate insulating film formed on the lower silicon oxide film and containing a metal element, the intermediate insulating film having a relative dielectric constant of greater than 7, an upper silicon oxide film formed on the intermediate insulating film, and an upper silicon nitride film formed on the upper silicon oxide film, at least one of the lower silicon oxide film and the upper silicon oxide film having a chlorine concentration of at least $1 \times 10^{19}$ atoms/cm$^3$.

A semiconductor device in accordance with a eleventh aspect of the present invention has a plurality of memory cells each comprising: a first insulating film formed on a semiconductor substrate; a charge storage layer formed on the first insulating film; a second insulating film formed on the charge storage layer; and a control electrode formed on the second insulating film, the second insulating film including a high dielectric constant insulating film containing a metal element and having a relative dielectric constant of greater than 7, the high dielectric constant insulating film having a first part formed along a top surface of the charge storage layer, a second part formed along a side surface of the charge storage layer, and a third part formed between the adjacent charge storage layers, the third part having a lower oxygen concentration than the first part.

A method for manufacturing a semiconductor device in accordance with a twelfth aspect of the present invention comprises: forming a first insulating film on a semiconductor substrate; forming a charge storage layer on the first insulating film; forming a second insulating film on the charge storage layer; and forming a control electrode film on the second insulating film, forming the second insulating film including one of forming a first film structure, forming a second film structure, and forming a third film structure, forming the first film structure including forming a lower silicon oxide film, forming an intermediate insulating film on the lower silicon oxide film, the intermediate insulating film containing a metal element and oxygen and having a relative dielectric constant of greater than 7, and forming an upper silicon oxide film on the intermediate insulating film; forming the second film structure including forming a lower silicon nitride film, forming a lower silicon oxide film on the lower silicon nitride film, forming an intermediate insulating film on the lower silicon oxide film, the intermediate insulating film containing a metal element and oxygen and having a relative dielectric constant of greater than 7, forming an upper silicon oxide film on the intermediate insulating film, and forming an upper silicon nitride film on the upper silicon oxide film; forming the third film structure including forming a lower silicon nitride film, forming an intermediate insulating film on the lower silicon nitride film, the intermediate insulating film containing a metal element and oxygen and having a relative dielectric constant of greater than 7, and forming an upper silicon nitride film on the intermediate insulating film, the intermediate insulating film being formed by CVD or ALD using ozone or oxygen radicals as an oxygen source.

A method for manufacturing a semiconductor device in accordance with a thirteenth aspect of the present invention comprises: forming a first insulating film on a semiconductor substrate; forming a charge storage layer on the first insulating film; forming a second insulating film on the charge storage layer; and forming a control electrode film on the second insulating film, forming the second insulating film including one of forming a first film structure, forming a second film structure, and forming a third film structure, forming the first film structure including forming a lower silicon oxide film, forming an intermediate insulating film on the lower silicon oxide film, the intermediate insulating film containing a metal element and oxygen and having a relative dielectric constant of greater than 7, and forming an upper silicon oxide film on the intermediate insulating film; forming the second film structure including forming a lower silicon nitride film, forming a lower silicon oxide film on the lower silicon nitride film, forming an intermediate insulating film on the lower silicon oxide film, the intermediate insulating film containing a metal element and oxygen and having a relative dielectric constant of greater than 7, forming an upper silicon oxide film on the intermediate insulating film, and forming an upper silicon nitride film on the upper silicon oxide film; forming the third film structure including forming a lower silicon nitride, forming an intermediate insulating film on the lower silicon nitride film, the intermediate insulating film containing a metal element and oxygen and having a relative dielectric constant of greater than 7, and forming an upper silicon nitride film on the intermediate insulating film, the intermediate insulating film being formed by CVD or ALD using water vapor as an oxygen source.

A method for manufacturing a semiconductor device in accordance with a fourteenth aspect of the present invention comprises: forming a first insulating film on a semiconductor substrate; forming a charge storage layer on the first insulating film; forming a second insulating film on the charge storage layer; and forming a control electrode film on the second insulating film, forming the second insulating film including one of forming a first film structure, forming a second film structure, and forming a third film structure, forming the first film structure including forming a lower silicon oxide film, forming an intermediate insulating film on the lower silicon oxide film, the intermediate insulating film containing a metal element and oxygen and having a relative dielectric constant of greater than 7, and forming an upper silicon oxide film on the intermediate insulating film; forming the second film structure including forming a lower silicon nitride film, forming a lower silicon oxide film on the lower silicon nitride film, forming an intermediate insulating film on the lower silicon oxide film, the intermediate insulating film containing a metal element and oxygen and having a relative dielectric constant of greater than 7, forming an upper silicon oxide film on the intermediate insulating film, and forming an upper silicon nitride film on the upper silicon oxide film; forming the third film structure including forming a lower silicon nitride film, forming an intermediate insulating film on the lower silicon nitride film, the intermediate insulating film containing a metal element and oxygen and having a relative dielectric constant of greater than 7, and forming an upper silicon nitride film on the intermediate insulating film, forming the second insulating film including, after forming the intermediate insulating film, performing a heat treatment at a temperature higher than that at which the intermediate insulating film is formed.

A method for manufacturing a semiconductor device in accordance with a fifteenth aspect of the present invention comprises: forming a first insulating film on a semiconductor substrate; forming a charge storage layer on the first insulating film; forming a second insulating film on the charge storage layer; and forming a control electrode film on the second insulating film, forming the second insulating film including one of forming a second film structure, and forming a third film structure, forming the second film structure including forming a lower silicon nitride film, forming a lower silicon oxide film on the lower silicon nitride film, forming an intermediate insulating film on the lower silicon oxide film, the intermediate insulating film containing a metal element and having a relative dielectric constant of greater than 7, forming an upper silicon oxide film on the intermediate insulating film, and forming an upper silicon nitride film on the upper silicon oxide film; forming the third film structure including forming a lower silicon nitride film, forming an intermediate insulating film on the lower silicon nitride film, the intermediate insulating film containing a metal element and having a relative dielectric constant of greater than 7, and forming an upper silicon nitride film on the intermediate insulating film, forming the second insulating film including, after forming the lower silicon nitride film, performing a heat treatment at a temperature higher than that at which the lower silicon nitride film is formed.

A method for manufacturing a semiconductor device in accordance with a sixteenth aspect of the present invention comprises: forming a first insulating film on a semiconductor substrate; forming a charge storage layer on the first insulating film; forming a second insulating film on the charge storage layer; and forming a control electrode film on the second insulating film, forming the second insulating film including forming a silicon nitride film on the charge storage layer, forming the silicon nitride film including forming a silicon layer on the charge storage layer and nitriding the silicon layer.

BRIEF DESCRIPTION OF THE SEVERAL VIEWS OF THE DRAWING

FIGS. 1A and 1B are sectional views schematically showing a part of a basic process of manufacturing a semiconductor device in accordance with embodiments of the present invention;

FIGS. 2A and 2B are sectional views schematically showing a part of the basic process of manufacturing a semiconductor device in accordance with the embodiments of the present invention;

FIGS. 3A and 3B are sectional views schematically showing a part of the basic process of manufacturing a semiconductor device in accordance with the embodiments of the present invention;

FIGS. 4A and 4B are sectional views schematically showing a part of the basic process of manufacturing a semiconductor device in accordance with the embodiments of the present invention;

FIG. 7 is a diagram showing the relationship between a film thickness ratio (film thickness of a silicon oxide film/film thickness of a high dielectric constant insulating film) and a leakage current in accordance with the first embodiment of the present invention;

FIG. 8 is a diagram showing the relationship between the concentration of a transition metal element and the thickness of an interface layer;

FIG. 15 is a sectional view schematically showing the detailed configuration of a semiconductor device in accordance with a third embodiment of the present invention;

FIGS. 16A and 16B are sectional views showing a part of a process of manufacturing a semiconductor device in accordance with the third embodiment of the present invention in detail;

FIG. 17 is a diagram showing the relationship between the concentration of carbon in the high dielectric constant insulating film and a leakage current density in accordance with a fourth embodiment of the present invention;

FIG. 18 is a diagram showing the relationship between the concentration of carbon in the high dielectric constant insulating film and an etching rate in accordance with the fourth embodiment of the present invention;

FIG. 21 is a diagram showing the relationship between the concentration of hydrogen in the high dielectric constant insulating film and the leakage current density in accordance with a sixth embodiment of the present invention;

FIG. 22 is a diagram showing measurements of electric capacitance in accordance with the sixth embodiment of the present invention;

FIG. 23 is a sectional view schematically showing the detailed configuration of a semiconductor device in accordance with an eighth embodiment of the present invention;

FIG. 24 is a sectional view showing a part of a process of manufacturing a semiconductor device in accordance with the eighth embodiment of the present invention in detail;

FIG. 32 is a diagram showing the effects of the heat treatment in accordance with the third embodiment of the present invention;

FIG. 33 is a diagram showing the relationship between the heat treatment temperature and a low electric field leakage current in accordance with the third embodiment of the present invention;

FIG. 34 is a sectional view schematically showing a part of a process of manufacturing a semiconductor device in accordance with an eleventh embodiment of the present invention;

FIG. 35 is a sectional view schematically showing a part of the process of manufacturing a semiconductor device in accordance with the eleventh embodiment of the present invention;

FIG. 37 is a sectional view schematically showing a part of the process of manufacturing a semiconductor device in accordance with a twelfth embodiment of the present invention;

FIG. 38 is a diagram showing the relationship between the temperature at which a silicon nitride film is formed and the concentration of hydrogen in an isolation insulating film in accordance with the twelfth embodiment of the present invention; and FIG. 39 is a diagram showing the relationship between the temperature at which the silicon nitride film is formed and a leakage current of an inter-electrode insulating film in accordance with the twelfth embodiment of the present invention.

DETAILED DESCRIPTION OF THE INVENTION

Figure 5A:
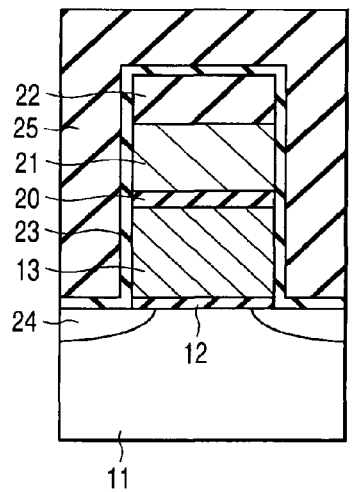
FIGS. 5A and 5B are sectional views schematically showing a part of the basic process of manufacturing a semiconductor device in accordance with the embodiments of the present invention.

Embodiments of the present invention will be described below with reference to the drawings.

Embodiment 1

With reference to FIGS. 1A and 1B to 5A and 5B, description will be given of a basic method for manufacturing a semiconductor device (nonvolatile semiconductor memory device) in accordance with the present embodiment. FIGS. 1A to 5A are sectional views in a bit line direction (channel length directions). FIGS. 1B to 5B are sectional views in a word line direction (channel width direction).

First, as shown in FIGS. 1A and 1B, a tunnel insulating film (first insulating film) 12 of thickness 6 nm is formed on a surface of a silicon substrate (semiconductor substrate) 11 doped with impurities by pyrolysis oxidation. A phosphorus-doped polycrystalline silicon film of thickness 100 nm is subsequently formed by CVD (Chemical Vapor Deposition) as a floating gate electrode film 13. Moreover, a mask film 14 is formed by CVD.

Then, the mask film 14, polycrystalline silicon film 13, tunnel insulating film 12, and silicon substrate 11 are sequentially etched by RIE (Reactive Ion Etching) through a first resist mask (not shown) as a mask. This forms an element formation area 15 and an isolation trench 16. Both the element formation area 15 and the isolation trench 16 have a width of about 50 nm.

Then, as shown in FIGS. 2A and 2B, a silicon oxide film is formed on the mask film 14 and in the isolation trench 16 as an isolation insulating film 17. The silicon oxide film 17 on the mask film 14 is removed by CMP (Chemical Mechanical Polishing), with the silicon oxide film 17 in the isolation trench 16 left.

Then, as shown in FIGS. 3A and 3B, the mask film 14 is etched away with a chemical or the like to expose a top surface of the polycrystalline silicon film 13. An upper part of the silicon oxide film 17 is etched away with a diluted fluorinated acid solution to expose the upper part of side surfaces of the polycrystalline silicon film 13. The exposed side surfaces have a height of about 50 nm.

Then, as shown in FIGS. 4A and 4B, an inter-electrode insulating film (second insulating film) 20 is formed all over the surface of the resulting structure. The inter-electrode insulating film 20 will be described below in detail. Subsequently, a control gate electrode film 21 of thickness 100 nm is formed on the inter-electrode insulating film 20. The control gate electrode film 21 has a stack structure including the polycrystalline silicon film and a tungsten silicide film. A silicon nitride film is deposited by CVD as a mask film 22 for RIE.

Then, a second resist mask (not shown) having a pattern orthogonal to the pattern of the first resist mask is formed on the silicon nitride film 22. The mask film 22, control gate electrode film 21, inter-electrode insulating film 20, polycrystalline silicon film 13, and tunnel insulating film 12 are sequentially etched by RIE through the second resist mask as a mask. This forms a floating gate electrode (charge storage layer) 13 and a control gate electrode (control electrode) 21. The width of the floating gate electrode 13 and the distance between the floating gate electrodes 13 are both about 50 nm.

Figure 5B:
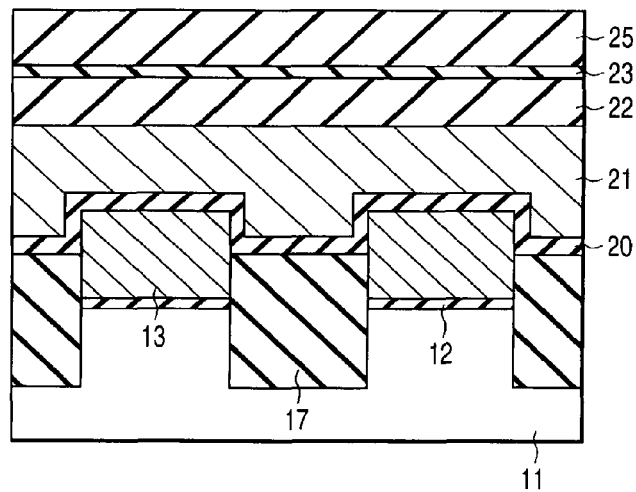

Then, as shown in FIGS. 5A and 5B, a gate sidewall film 23 of thickness about 10 nm is formed by thermal oxidation or CVD so as to cover the gate structure obtained in the steps shown in FIGS. 4A and 4B. An impurity diffusion layer 24 constituting a source/drain area is formed by ion implantation and thermal annealing. An interlayer insulating film 25 is formed by CVD. Wiring and the like (not shown) are further formed using a well-known technique.

As described above, a nonvolatile semiconductor memory device is obtained which comprises the silicon substrate (semiconductor substrate) 11, the tunnel insulating film (first insulating film; electric capacitance C1) 12 formed on the silicon substrate 11, the floating gate electrode (charge storage layer) 13 formed on the tunnel insulating film 12, the inter-electrode insulating film (second insulating film; electric capacitance C2) 20 formed on the floating gate electrode 13, the control gate electrode (control electrode) 21 formed on the inter-electrode insulating film 20, and the impurity diffusion layers 24 sandwiching a channel area under the floating gate electrode 13.

In each memory cell in the nonvolatile semiconductor memory device thus obtained, a high voltage is applied to between the silicon substrate 11 and the control gate electrode 21 to apply an electric field corresponding to a coupling ratio (C2/(C1+C2)) to the tunnel insulating film 12. This allows a tunnel current to pass through the tunnel insulating film 12. This changes the amount of charge stored in the floating gate electrode 13 and thus a threshold for the memory cell to perform a data programming or erasing operation.

In an actual nonvolatile semiconductor memory device, a plurality of memory cells are arranged in a word like direction and a bit line direction. A typical example of the above nonvolatile semiconductor memory device is a NAND type nonvolatile memory having a plurality of series connected memory cells between select transistors.

The above description relates to the basic configuration of and the basic manufacturing method for the nonvolatile semiconductor memory device. The above basic configuration of and the basic manufacturing method for the nonvolatile semiconductor memory device are also applicable to other embodiments.

Figure 6A:
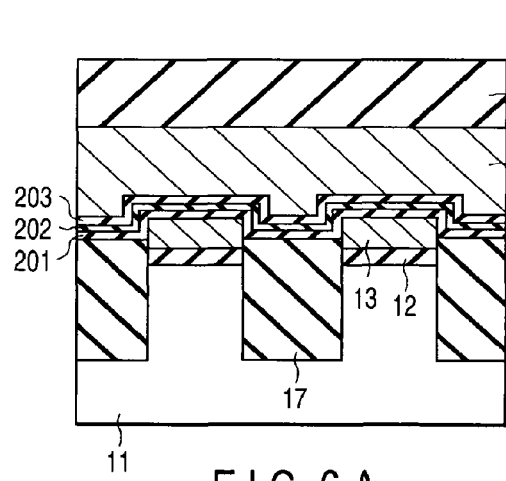
FIGS. 6A and 6B are sectional views schematically showing the detailed configuration of a semiconductor device in accordance with a first embodiment of the present invention.
Figure 6B:
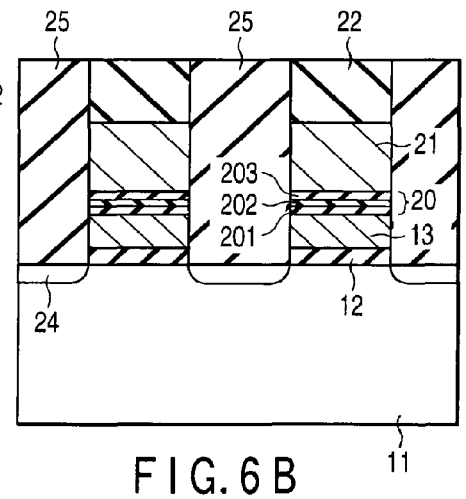

FIGS. 6A and 6B are sectional views schematically showing the detailed configuration of the nonvolatile semiconductor memory device in accordance with the present embodiment. FIG. 6A is a sectional view in the word line direction (channel width direction). FIG. 6B is a sectional view in the bit line direction (channel length direction). Components corresponding to those shown in FIGS. 1A and 1B to 5A and 5B are denoted by the same reference numerals with their detailed description omitted.

As shown in FIGS. 6A and 6B, the inter-electrode insulating film 20 is formed of a stack film including a lower silicon oxide film 201, a high dielectric constant insulting film (intermediate insulating film) 202 formed on the lower silicon oxide film 201, and an upper silicon oxide film 203 formed on the high dielectric constant insulating film 202. The high dielectric constant insulating film 202 contains at least a metal element and has a relative dielectric constant greater than 7. That is, the high dielectric constant insulating film 202 has a relative dielectric constant greater than that (about 7) of a typical silicon nitride film ($Si_3N_4$). The high dielectric constant insulating film 202 preferably contains oxygen in addition to a metal element.

As described above, the inter-electrode insulating film 20 has the stack structure including the lower silicon oxide film 201, high dielectric constant insulating film 202, and upper silicon oxide film 203. This enables a sharp reduction in a leakage current of the inter-electrode insulating film 20 when a low electric field of at most about 10 MV/cm is applied. This enables a sufficient memory retention characteristic to be offered. Further, the amount of charge trapped is sharply reduced, and trapped charge is unlikely to be discharged. This makes it possible to avoid memory malfunctions resulting from a variation in the threshold for the memory cell. Moreover, a breakdown voltage significantly increases, enabling the realization of a sufficient memory operation speed.

By providing the silicon oxide films 201 and 203 having a larger barrier height than the high dielectric constant insulating film 202, it is possible to reduce the leakage current generated when a low electric field is applied to the inter-electrode insulating film 20 for memory retention or the like. The lower silicon oxide film 201 is effective for retaining the threshold for a programming cell. The upper silicon oxide film 203 is effective for retaining the threshold for an erasing cell.

Providing the upper silicon oxide film 203 enables the prevention of problems such as possible oxygen vacancies in the high dielectric constant insulating film 202 caused by a reducing atmosphere (for example, a silane ($SiH_4$) gas atmosphere) in which the control gate electrode film 21 is formed. A reduction in oxygen vacancies in the high dielectric constant insulating film 202 makes it possible to inhibit an increase in leakage current and a decrease in breakdown voltage. Providing the silicon oxide films 201 and 203 on the respective sides of the high dielectric constant insulating film 202 allows the silicon oxide films 201 and 203 to supply oxygen to oxygen vacancies generated in the step of forming a high dielectric constant insulating film 202 and the subsequent steps. As a result, the oxygen vacancies can be reduced.

Further, by providing the silicon oxide films 201 and 203 with a large barrier height on the respective sides of the high dielectric constant insulating film 202, it is possible to reduce charge (trapped charge) trapped in the high dielectric constant insulating film during a programming/erasing operation. Furthermore, trapped charge is unlikely to be emitted toward the control gate electrode 21 or floating gate electrode 13. Such an excellent trap characteristic makes it possible to inhibit a variation in the threshold for each memory cell.

The silicon oxide films 201 and 203 desirably have a large film thickness in connection with the supply of oxygen to the high dielectric constant insulating film 202. When the silicon oxide films 201 and 203 have a film thickness of at least 1.5 nm, the characteristics of the high dielectric constant insulating film 202 can be improved by oxygen supply. Accordingly, at least one of the silicon oxide films 201 and 203 desirably has a film thickness of at least 1.5 nm. If the high dielectric constant insulating film 202 contains transition metal, oxygen vacancies are likely to occur. Thus, silicon oxide films of thickness at least 2 nm are desirably provided in order to produce a sufficient characteristic improving effect.

To effectively feed oxygen from the silicon oxide films 201 and 203 to the high dielectric constant insulating film 202, the silicon oxide films 201 and 203 desirably have a film thickness greater than that of the high dielectric constant insulating film 202. Setting the film thickness as described above enables oxygen to be sufficiently fed to the entire high dielectric constant insulating film 202 in the film thickness direction, allowing oxygen vacancies to be sufficiently reduced.

FIG. 7 is a diagram showing the relationship between film thickness ratio (the film thickness of the silicon oxide film/the film thickness of the high dielectric constant insulating film) and a leakage current (a leakage current generated during reading from a memory cell). The lower silicon oxide film 201 and the upper silicon oxide film 203 have the same film thickness. Although hafnium aluminium oxide (hafnium aluminate: HfAlO) is used for the high dielectric constant insulating film 202, similar characteristics are obtained by using aluminium oxide (alumina: $Al_2O_3$). As is apparent from FIG. 7, setting the film thickness of the silicon oxide films 201 and 203 greater than that of the high dielectric constant insulating film 202 enables the leakage current to be sharply reduced. The film thickness of the silicon oxide films smaller than that of the high dielectric constant insulating film results in the formation of a leakage path attributed to oxygen vacancies in the high dielectric constant insulating film. This prevents a sufficient reduction in leakage current. The film thickness of the silicon oxide films greater than that of the high dielectric constant insulating film enables a sufficient reduction in oxygen vacancies in the high dielectric constant insulating film. This makes it possible to sharply reduce the leakage current.

Thus, at least one of the lower silicon oxide film 201 and the upper silicon oxide film 203 has a greater film thickness than the high dielectric constant insulating film 202.

As described above, the high dielectric constant insulating film 202 has a greater relative dielectric constant than a typical silicon nitride film ($Si_3N_4$); the typical silicon nitride film has a relative dielectric constant of about 7. Consequently, an inter-electrode insulating film is obtained which has a greater dielectric constant than a stack film (what is called an ONO film) in which a silicon nitride film is provided between the silicon oxide films. Specifically, the high dielectric constant insulating film 202 may be formed as described below.

For example, the high dielectric constant insulating film 202 may be an aluminium oxide ($Al_2O_3$) film with a relative dielectric constant of about 8, a magnesium oxide (MgO) film with a relative dielectric constant of about 10, a yttrium oxide ($Y_2O_3$) film with a relative dielectric constant of about 16, or a hafnium oxide ($HfO_2$) film, zirconium oxide ($ZrO_2$) film, or lanthanum oxide ($La_2O_3$) film with a relative dielectric constant of about 22. The high dielectric constant insulating film 202 may also be a hafnium aluminate (HfAlO) film or the like which is formed of an oxide consisting of two types of metals. The high dielectric constant insulating film 202 may also be a hafnium silicate (HfSiO) film or the like which is metal silicate. The high dielectric constant insulating film 202 may also contain nitrogen. That is, the high dielectric constant insulating film 202 may comprise an oxide or an oxinitrde containing a metal component such as aluminium (Al), magnesium (Mg), yttrium (Y), hafnium (Hf), zirconium (Zr), or lanthanum (La).

The present inventors have found that the above high dielectric constant material reduces a leakage current of the inter-electrode insulating film when a high electric field of at least about 10 MV/cm is applied for a programming/erasing operation, and increases memory operation speed. This effect is particularly significantly exerted by materials having a greater work function than silicon nitrides or having a greater trap density.

If the high dielectric constant insulating film 202 contains transition metal such as Y, Zr, Hf, or La, the catalytic action of the transition metal generates much active oxygen in an oxidation atmosphere during the manufacturing process (for example, an oxidizing step after the formation of the high dielectric constant insulating film 202, an oxidizing step after the formation of the upper silicon oxide film 203, an electrode sidewall oxidizing step after processing of the electrode, or the like). This makes it possible to improve the high dielectric constant insulating film 202 and the silicon oxide films 201 and 203. Accordingly, the containment of the transition metal is suitable for the case where the inter-electrode insulating film needs to offer excellent insulating characteristics (reduced leakage current, improved breakdown voltage, reduced trapped charge, and the like). In particular, the above improvement is effective when the high dielectric constant insulating film 202 is an oxide. This is expected to be due to the high efficiency with which active oxygen is generated or diffused.

As described below, to achieve the effective improvement, the following is preferably satisfied:

$$T/(T+M+S) \geq 0.2$$

where T is the concentration of the transition metal element in the high dielectric constant insulating film 202 (T>0), M is the concentration of a metal element other than the transition metal element in the high dielectric constant insulating film 202 ($M \geq 0$), and S is the concentration of a semiconductor element (for example, Si or Ge) in the high dielectric constant insulating film 202 ($S \geq 0$).

FIG. 8 is a diagram showing the relationship between the transition metal element concentration (T/(T+M+S)) and the thickness of an interface layer. Samples used for measurements were obtained by forming hafnium aluminate (HfAlO) on a silicon substrate as a high dielectric constant insulating film and then performing a heat treatment in an oxygen atmosphere at 700° C. for 30 minutes. An Hf concentration (transition metal element concentration) of at least 20% increases the thickness of the interface layer formed between the silicon substrate and the hafnium aluminate film. This is because the catalytic action of Hf allows much active oxygen to be fed to the surface of the silicon substrate. A similar catalytic effect can also be produced by transition metals (Y, Zr, La, and the like) other than Hf. Accordingly, the transition metal element concentration (T/(T+M+S)) is desirably at least 20%.

On the other hand, if the high dielectric constant insulating film 202 comprises aluminium oxide or magnesium oxide containing no transition metal, the above catalytic action is suppressed. This makes it possible to reduce the amount of oxidation of a bird's beak formed at the interface between the silicon oxide films 201 and 203 and the control gate electrode 21 and floating gate electrode 13. This in turn inhibits a decrease or variation in the electric capacitance of the inter-electrode insulating film 20. Therefore, if the capacitance ratio (coupling ratio) of the inter-electrode insulating film 20 to the tunnel insulating film 12 needs to be controllable, a high dielectric constant insulating film containing no transition metal is desirable.

The crystal state of the high dielectric constant insulating film 202 may be any of an amorphous state, an amorphous state containing a microcrystal, a polycrystal, and a single crystal. However, the leakage current of the high dielectric constant insulating film and the film density have a correlation; a higher density more significantly reduces the leakage current. The polycrystal and single crystal offers a high crystallinity and enables an increase in film density. Thus, the high dielectric constant insulating film 202 is desirably a polycrystalline film or a single crystal film. Further, if the high dielectric constant insulating film 202 is polycrystalline, the high dielectric constant insulating film 202 and the silicon oxide films 201 and 203 can be sufficiently improved. This is expected to be due to the sufficient supply of an oxidizer to the silicon oxide film through the crystal grain boundary of the high dielectric constant insulating film. Therefore, the high dielectric constant insulating film 202 is desirably formed of a polycrystalline film.

To improve the silicon oxide film by supplying an oxidizer through the crystal grain boundary, it is desirable to set the size (average grain size, average grain diameter) of crystal grains equal to or smaller than 100 nm. This value is expected to depend on the diffusion length of the oxidizer. For a sufficient improvement effect, it is desirable that crystal grain size is smaller than that of the memory cell. For example, a columnar crystal having a crystal grain size of at most 10 nm.

Figure 9:
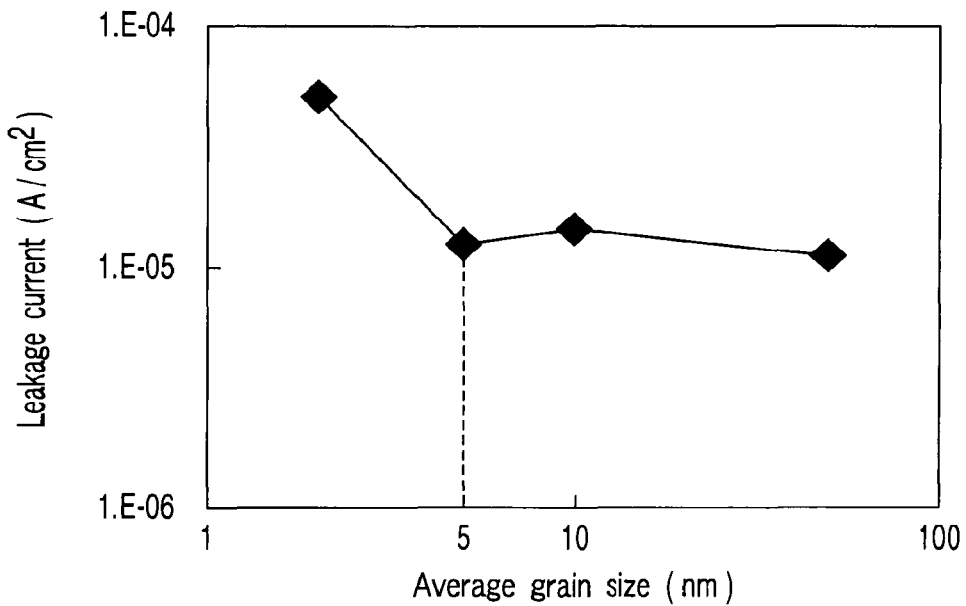
FIG. 9 is a diagram showing the relationship between the average grain size of crystal grains contained in the high dielectric constant insulating film and a leakage current in accordance with the first embodiment of the present invention.

In view of the leakage characteristic of the high dielectric constant insulating film, the crystal grains contained in the high dielectric constant insulating film desirably have an average grain size (average grain diameter) of at least 5 nm. This is because an average grain size of less than 5 nm reduces the film density, preventing a reduction in leakage current. FIG. 9 is a diagram showing the relationship between the average grain size and the leakage current. Although hafnium aluminate (HfAlO) is used for the high dielectric constant insulating film, similar characteristics are obtained by using aluminium oxide ($Al_2O_3$). FIG. 9 shows that an average grain size of less than 5 nm increases the amount of leakage current.

Thus, the crystal grains contained in the high dielectric constant insulating film 202 desirably have an average grain size (average grain diameter) of at least 5 nm. Further, the crystal grains contained in the high dielectric constant insulating film 202 desirably have an average grain size (average grain diameter) of at most 100 nm.

The crystal grain boundary of the crystal grains contained in the high dielectric constant insulating film 202 desirably penetrates the high dielectric constant insulating film 202 in its thickness direction. This allows the silicon oxide films 201 and 203 to be more effectively improved. The crystal grain boundary penetrating the high dielectric constant insulating film 202 enables an oxidizer be sufficiently supplied to the silicon oxide films 201 and 203 in an oxidation atmosphere step after the formation of an inter-electrode insulating film or the processing of electrodes. The silicon oxide films 201 and 203 are thus effectively improved.

The thickness of the high dielectric constant insulating film 202 equal to or greater than that of one atomic layer reduces the leakage current of the inter-electrode insulating film during a programming/erasing operation and increases the memory operation speed. A thicker high dielectric constant insulating film more significantly exerts this effect. However, an excessively thick high dielectric constant insulating film degrades the data retention characteristic of the memory cell. This is because the excessively thick high dielectric constant insulating film increases the amount of leakage current at a low electric field and increases the amount of charge trapped. The increase in the amount of low electric field leakage current is expected to be due to the small barrier height of the high dielectric constant insulating film. Electric conduction resulting from the trap level of the high dielectric constant insulating film is also expected to be a factor that causes low electric field leakage. Setting the film thickness of the high dielectric constant insulating film equal to or smaller than 5 nm makes it possible to inhibit the data retention characteristic from being degraded.

Figure 10:
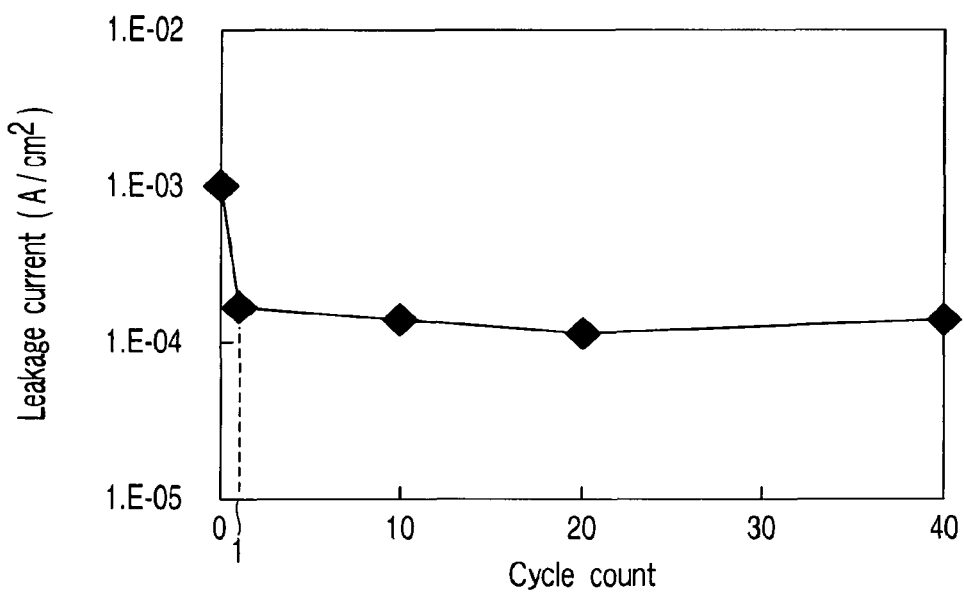
FIG. 10 is a diagram showing the relationship between the number of cycles for the growth of an atomic layer in the high dielectric constant insulating film and the leakage current in accordance with the first embodiment of the present invention.

FIG. 10 is a diagram showing the relationship between the number of cycles for the growth of atomic layers of the high dielectric constant insulating film 202 and the leakage current. Although aluminium oxide ($Al_2O_3$) is used for the high dielectric constant insulating film, similar characteristics are obtained by using hafnium aluminate (HfAlO). FIG. 10 shows that the leakage current is reduced by the execution of at least one cycle, that is, the formation of at least one atomic layer of the high dielectric constant insulating film.

Figure 11:
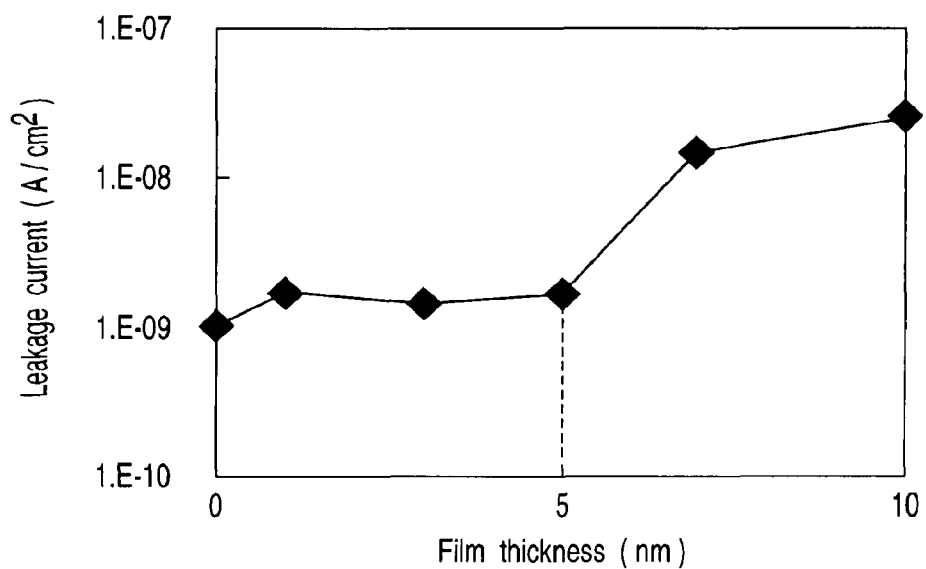
FIG. 11 is a diagram showing the relationship between the film thickness of the high dielectric constant insulating film and the leakage current in accordance with the first embodiment of the present invention.

FIG. 11 is a diagram showing the relationship between the film thickness of the high dielectric constant insulating film 202 and the low electric field leakage current. Although aluminium oxide ($Al_2O_3$) is used for the high dielectric constant insulating film, similar characteristics are obtained by using hafnium aluminate (HfAlO). FIG. 11 shows that the leakage current increases rapidly when the film thickness of the high dielectric constant insulating film exceeds 5 nm.

Thus, the thickness of the high dielectric constant insulating film 202 is desirably equal to or greater than that of one atomic layer and equal to or smaller than 5 nm.

If the high dielectric constant insulating film 202 is formed of an insulating film containing transition metal, a large amount of charge is trapped. Accordingly, to provide the memory cell with a sufficient data retention characteristic, it is desirable to set the film thickness of the high dielectric constant insulating film 202 equal to or smaller than 4 nm.

Figures 12A, 12B:
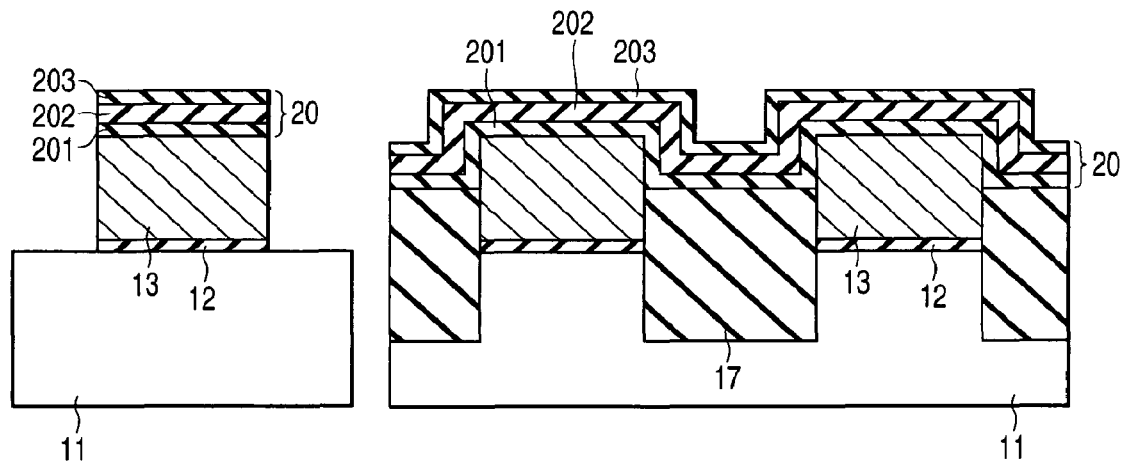
FIGS. 12A and 12B are sectional views schematically showing a part of a process of manufacturing a semiconductor device in accordance with the first embodiment of the present invention in detail.

FIGS. 12A and 12B are sectional views showing in detail a part of the process for manufacturing a semiconductor device shown in FIGS. 1A and 1B to 5A and 5B and 6A and 6B. FIG. 12A is a sectional view in the bit line direction (channel length direction). FIG. 12B is a sectional view in the word line direction (channel width direction).

After the steps shown in FIGS. 3A and 3B, a lower silicon oxide film 201 of thickness about 1 to 5 nm is formed by CVD on the exposed surfaces of the polycrystalline silicon film (floating gate electrode film) 13 and the silicon oxide film (isolation insulating film) 17. An aluminium oxide film as a high dielectric constant insulating film 202 is subsequently formed on the surface of the lower silicon oxide film 201 by ALD (Atomic Layer Deposition). The film thickness of the aluminum oxide film 202 is equal to or greater than that of one atomic layer and equal to or smaller than 5 nm. Further, an upper silicon oxide film 203 of thickness about 1 to 5 nm is formed on the surface of the aluminium oxide film 202 by CVD. This results in an inter-electrode insulating film 20 formed of the lower silicon oxide film 201, high dielectric constant insulating film 202, and upper silicon oxide film 203. The subsequent steps are similar to those shown in FIGS. 1A and 1B to 5A and 5B.

With the above manufacturing method, the lower silicon oxide film 201 and upper silicon oxide film 203 are formed by CVD. However, a method such as ALD, thermal oxidation, radical oxidation, or sputtering may be used.

Further, with the above manufacturing method, the high dielectric constant insulating film 202 is formed by ALD. However, a method such as CVD or sputtering may be used. The present manufacturing method desirably uses ALD in order to ensure a uniform film thickness and to inhibit a variation in characteristics among the memory cells.

With the above manufacturing method, the high dielectric constant insulating film 202 formed may be heat-treated at a temperature higher than its formation temperature. The high temperature heat treatment makes it possible to improve the film quality of the high dielectric constant insulating film 202 and increases its density, providing a high dielectric constant insulating film 202 with excellent characteristics.

If the high dielectric constant insulating film 202 is formed of metal oxide such as aluminium oxide, it is formed by CVD or ALD using steam (water vapor), which diffuses readily in the insulating film, as oxygen source gas to supply steam to the entire lower silicon oxide film 201. This improves the insulating property of the lower silicon oxide film 201. In this case, a sufficient amount of steam can also be supplied to the interface between the lower silicon oxide film 201 and the polycrystalline silicon film (floating gate electrode film) 13. This improves an interface trap characteristic. Thus, steam (water vapor) can be effectively used as oxygen source gas to prevent the possible leakage of charge from the floating gate electrode 13 to the control gate electrode 21.

If the high dielectric constant insulating film 202 is formed of metal oxide such as aluminium oxide, it is formed by CVD or ALD using ozone or oxygen radicals, which have a small diffusion length in insulating film but a high oxidation power, as oxygen source gas. This significantly improves the insulating property of the surface area of the lower silicon oxide film 201. Therefore, ozone or oxygen radicals can be effectively used as oxygen source gas in order to recover the film quality of the lower silicon oxide film 201, for example, if reducing gas or halogen-containing gas, which may significantly degrade the film quality of the surface area of the lower silicon oxide film 201, is used as source gas for the high dielectric constant insulating film 202.

Description will be given below of the case where the high dielectric constant insulating film 202 is formed by CVD or ALD using ozone as oxygen source gas (oxidizer). Specifically, an aluminium oxide film is formed by ALD using ozone ($O_3$) as an oxygen source and trimethyl aluminium ($Al(CH_3)_3$) as an aluminium source.

The aluminium source is introduced into a reaction furnace to form an aluminium layer. Then, the reaction furnace is subjected to evacuation and purging with inert gas. Ozone is subsequently introduced into the reaction furnace to oxidize the aluminium layer, forming aluminium oxide. After evacuation and purging with inert gas, an aluminium source is introduced into the reaction furnace again. Thus, the alternate introduction of the aluminium source and ozone (oxygen source) into the reaction furnace results in the formation of an aluminium oxide film. Film formation pressure is at most 50 Torr, and film formation temperature is about 300° C.

Figure 28:
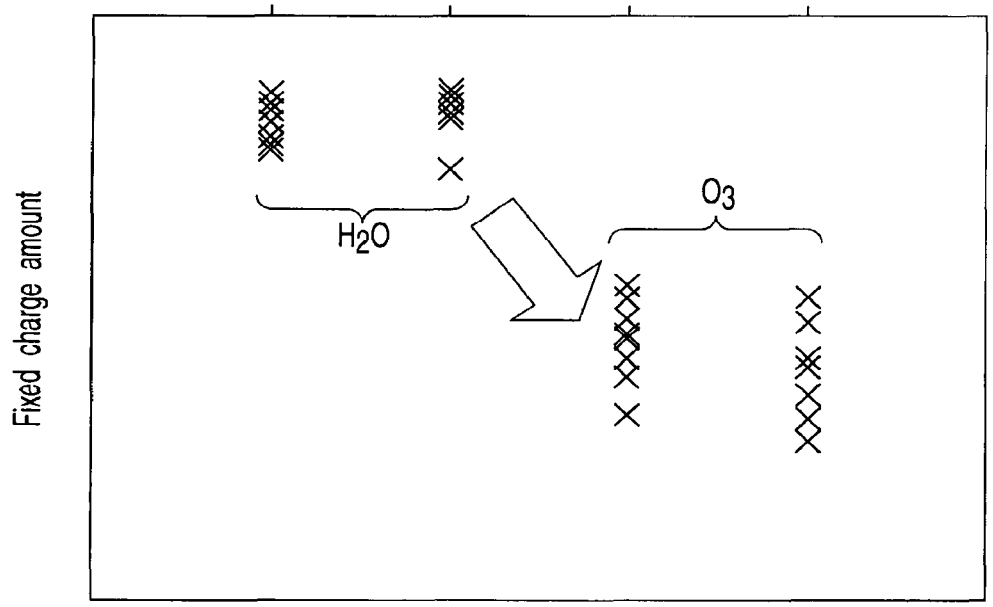
FIG. 28 is a diagram showing the amount of fixed charge in a memory cell when ozone or steam is used as an oxygen source for the high dielectric constant insulating film in accordance with the first embodiment of the present invention.

FIG. 28 is a diagram showing the amount of fixed charge in the memory cell when ozone ($O_3$) or steam ($H_2O$) is used as an oxygen source for the aluminium oxide film. As is apparent from FIG. 28, the use of ozone as an oxygen source enables a reduction in the fixed charge in memory cell. This is expected to be because the use of ozone as an oxygen source enables a reduction in carbon emitted from the aluminium oxide film during a subsequent thermal step. Carbon is expected to migrate from the aluminium oxide film on the isolation insulating film (silicon oxide film) to an element area via the isolation insulating film, where it becomes fixed charge. The fixed charge may vary the threshold of the memory cell. Therefore, the use of ozone as an oxygen source enables device characteristics to be improved.

The film formation temperature for the aluminium oxide film is preferably between 150° C. and 300° C. as shown below.

Figure 29:
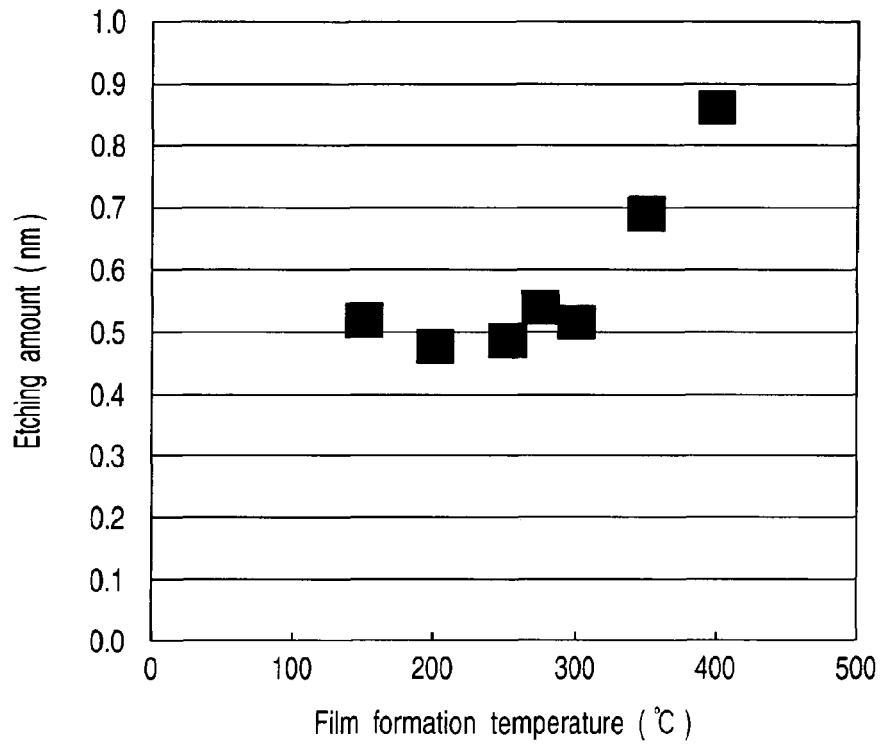
FIG. 29 is a diagram showing the relationship between the temperature at which an aluminium oxide film is formed and an etching amount in accordance with the first embodiment of the present invention.

The resistance of the aluminium oxide film to chemicals depends on the film formation temperature. Forming an aluminium oxide film at a temperature higher than 300° C. reduces the resistance of the aluminium oxide film to chemicals. FIG. 29 is a diagram showing the relationship between the film formation temperature of the aluminium oxide film and the etching amount observed when diluted fluorinated acid is used as a chemical. FIG. 29 shows that the etching amount increases at a film formation temperature of higher than 300° C. Therefore, the film formation temperature of the aluminium oxide film is preferably at most 300° C.

Figure 30:
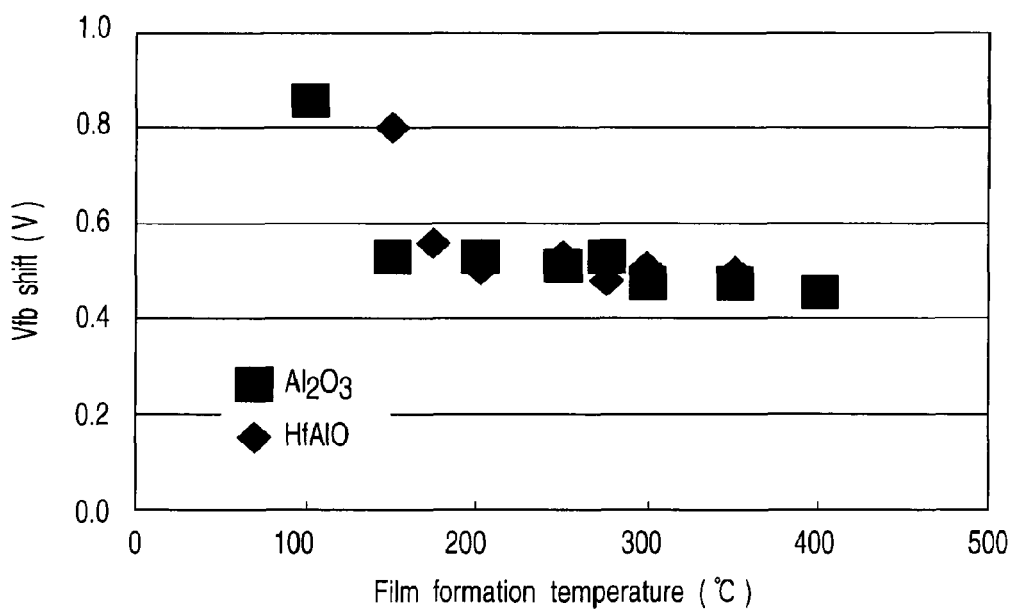
FIG. 30 is a diagram showing the relationship between the temperature at which an aluminium oxide film is formed and a Vfb shift in memory cells in accordance with the first embodiment of the present invention.

Setting the film formation temperature of the aluminium oxide film lower than 150° C. increases the concentration of carbon in the aluminium oxide film. For example, this reduces the film density and increases the amount of leakage current and fixed charge in the memory cell. FIG. 30 is a diagram showing the relationship between the film formation temperature of the aluminium oxide film and a flat band voltage shift (Vfb shift) in the memory cell. FIG. 30 shows that a film formation temperature of lower than 150° C. increases the magnitude of the Vfb shift, that is, increases the amount of fixed charge. Accordingly, the film formation temperature of the aluminium oxide film is preferably at least 150° C. FIG. 30 also shows the results obtained when a hafnium aluminium oxide (HfAlO) is used as a high dielectric constant insulating film. When the hafnium aluminium oxide film is used, its film formation temperature is preferably at least 175° C.

When an aluminium oxide film or a hafnium aluminium oxide film is formed, effects similar to those described above can be exerted by using oxygen radical instead of ozone as an oxygen source.

As described above, to improve the film quality of the high dielectric constant insulating film 202 and increase its density, the high dielectric constant insulating film 202 formed is preferably heat-treated at a temperature higher than its formation temperature. This makes it possible to, for example, reduce the leakage current, improve the resistance to chemicals, and inhibit possible defects (oxygen vacancies and metal vacancies) in the aluminium oxide film during the thermal step. The heat treatment may be performed in an inert gas atmosphere or in an oxidizing gas atmosphere. To inhibit possible oxygen vacancies during the thermal step, the oxidizing atmosphere is preferably used. To inhibit a possible increase in film thickness resulting from the heat treatment, the inert gas atmosphere is preferably used.

The temperature of the heat treatment after the formation of an aluminium oxide film is preferably at least 1,000° C. A heat treatment temperature of at least 1,000° C. enables etching resistance to be significantly improved. This makes it possible to inhibit a possible variation in the amount of side etching of the high dielectric constant insulating film and a possible variation in the coupling ratio (C2/(C1+C2)) of the memory cell. Further, the large side etching amount of the high dielectric constant insulating film increases the amount of high electric field leakage, degrading the programming/erasing characteristic of the memory cell. The above high temperature thermal process enables the etching resistance to be significantly improved, allowing the prevention of the above problems.

Figure 31:
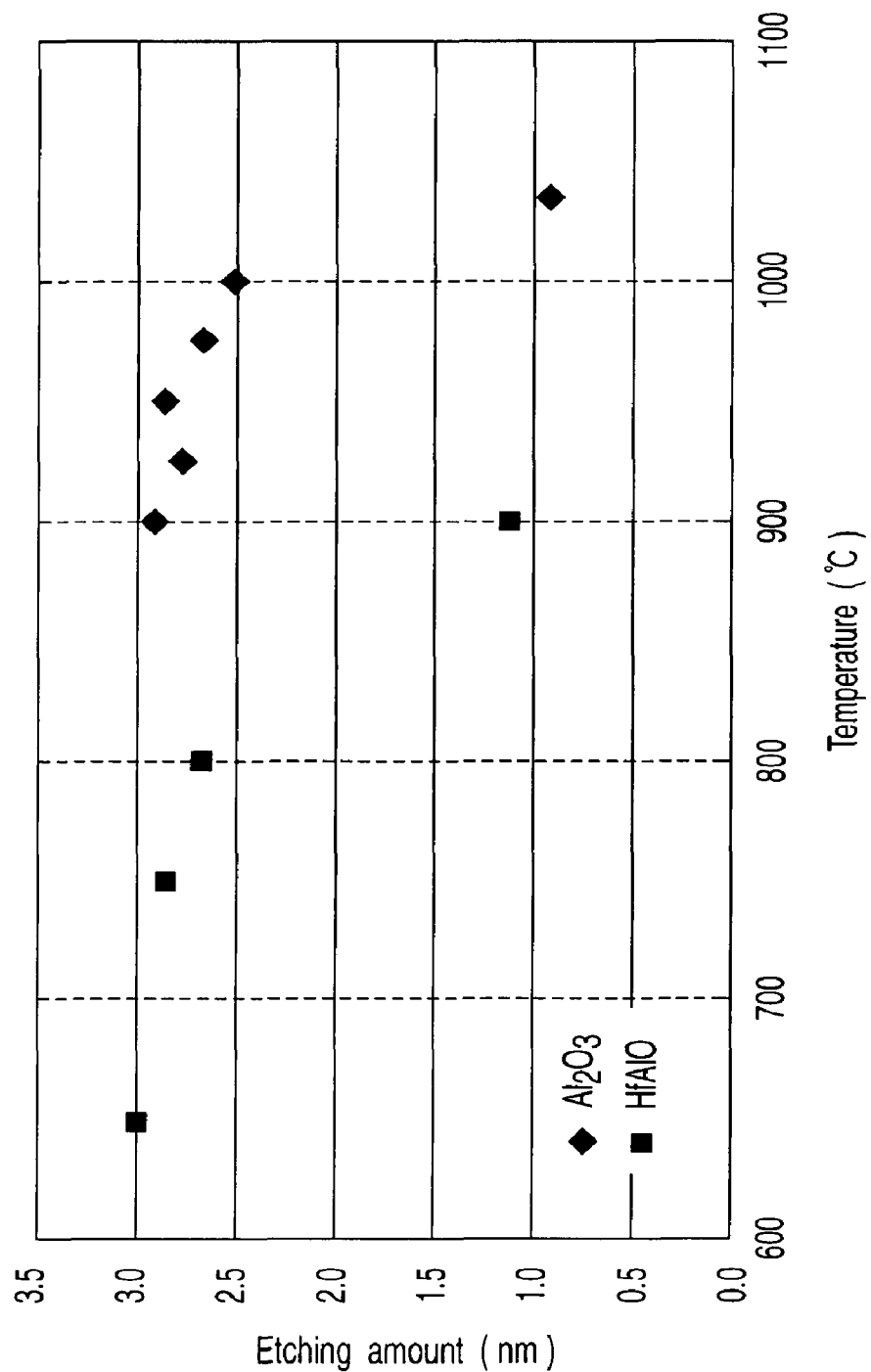
FIG. 31 is a diagram showing the relationship between a temperature for heat treatment after formation of an aluminium oxide film and the etching amount in accordance with the first embodiment of the present invention.

FIG. 31 is a diagram showing the relationship between the heat treatment temperature used after the formation of an aluminium oxide film and the etching amount (etching rate) of the aluminium oxide film with diluted fluorinated acid. FIG. 31 shows that a heat treatment temperature of at least 1,000° C. sharply reduces the etching amount (etching rate) of the aluminium oxide film. Consequently, the heat treatment temperature used after the formation of the aluminium oxide film is preferably at least 1,000° C. The time for the heat treatment is preferably at least one second. FIG. 31 also shows the results obtained when a hafnium aluminium oxide (HfAlO) film is used as a high dielectric constant insulating film. As shown in FIG. 31, when the hafnium aluminium oxide film is used, the heat treatment temperature used after its formation is preferably at least 900° C.

The aluminium source used to form a high dielectric constant insulating film such as an aluminium oxide film or a hafnium aluminium oxide film is not limited to trimethyl aluminium ($Al(CH_3)_3$). For example, the aluminium source may be obtained by changing the methyl group of trimethyl aluminium to an alkyl group (ethyl group or propyl group) having a larger carbon number than the methyl group. Alternatively, the aluminium source may be obtained by changing the methyl group of trimethyl aluminium to an alkoxide group such as a methoxy group.

The use of trimethyl aluminium as an aluminium source enables the formation of a high dielectric constant insulating film with a reduced carbon content. This also enables the formation of a high dielectric constant insulating film with improved uniformity and step coverage. Further, the use of an aluminium source having an alkyl group with a larger carbon number than the methyl group or having an alkoxide group increases the decomposition temperature of the source and thus the film formation temperature. The increased film formation temperature enables an increase in film density. The increased film formation temperature makes it possible to promote the improvement of the lower insulating film or the interface between the lower insulating film and the high dielectric constant insulating film based on the oxygen source (oxidizer).

Embodiment 2

Now, a second embodiment of the present invention will be described. A basic configuration and a basic manufacturing method in accordance with the second embodiment are similar to those in FIGS. 1A and 1B to 5A and 5B for the first embodiment and will not be described in detail. The matters described in the first embodiment will not be described in detail.

Figure 13:
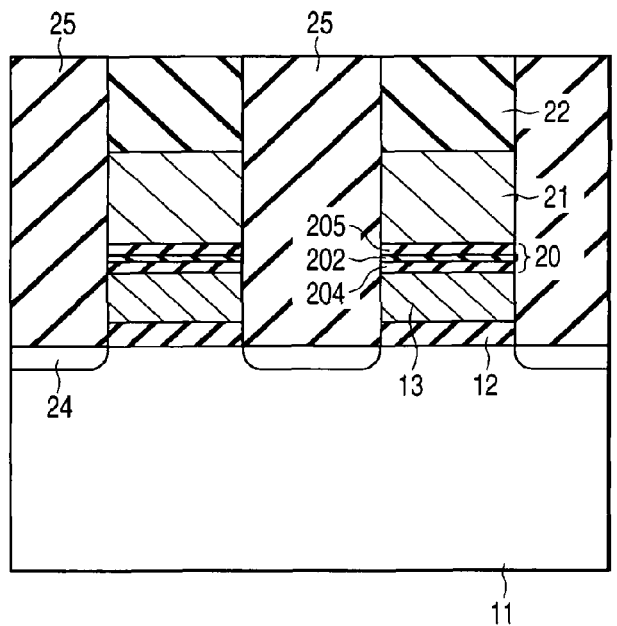
FIG. 13 is a sectional view schematically showing the detailed configuration of a semiconductor device in accordance with a second embodiment of the present invention.

FIG. 13 is a sectional view of a nonvolatile semiconductor memory device in accordance with the present embodiment in the bit line direction (channel length direction). Components corresponding to those shown in FIGS. 1A and 1B to 5A and 5B are denoted by the same reference numerals and will not be described in detail.

As shown in FIG. 13, the inter-electrode insulating film 20 is formed of a stack film including a lower silicon nitride film 204, a high dielectric constant insulting film (intermediate insulating film) 202 formed on the lower silicon nitride film 204, and an upper silicon nitride film 205 formed on the high dielectric constant insulating film 202. The high dielectric constant insulating film 202 contains at least a metal element and has a relative dielectric constant greater than 7. That is, the high dielectric constant insulating film 202 has a relative dielectric constant greater than that (about 7) of a typical silicon nitride film ($Si_3N_4$). The high dielectric constant insulating film 202 preferably contains oxygen in addition to a metal element.

As described above, the inter-electrode insulating film 20 has the stack structure including the lower silicon nitride film 204, high dielectric constant insulating film 202, and upper silicon nitride film 205. The insulating property of the high dielectric constant insulating film 202 is thus significantly improved. This makes it possible to ensure a memory retention characteristic, avoid memory malfunctions, and provide a sufficient memory operation speed. It is possible to inhibit a variation in the coupling ratio of the memory cell, sharply reducing a variation in memory cell characteristics.

The high dielectric constant insulating film is likely to undergo film structure defects such as oxygen vacancies as a result of the adverse effect of a reducing agent such as hydrogen (for example, hydrogen contained in a polycrystalline silicon film used as a floating gate electrode or control gate electrode) emitted from surrounding films during the manufacturing process. In the present embodiment, the silicon nitride films 204 and 205 are provided which can sufficiently inhibit the possible diffusion of the reducing agent such as hydrogen. This makes it possible to prevent the reducing agent from diffusing to the high dielectric constant insulating film 202 even though films are exposed to the reducing atmosphere during the manufacturing process. Thus, possible oxygen vacancies can be significantly inhibited, drastically improving the insulating property of the high dielectric constant insulating film.

The silicon nitride films 204 and 205, which can effectively inhibit the possible diffusion of the oxidizer, enables the prevention of oxidation of a bird's beak formed at the interface between the inter-electrode insulating film 20 and the control gate electrode 21 and at the interface between the inter-electrode insulating film 20 and the floating gate electrode 13.

Owing to its barrier height greater than that of the high dielectric constant insulating film, the silicon nitride film is effective in reducing a low electric field leakage current. The provision of the lower silicon nitride film 204 makes it possible to effectively prevent the metal element or the like contained in the high dielectric constant insulating film 202 from diffusing to the tunnel insulating film 12 or the isolation insulating film 17. This makes it possible to avoid the degradation of the insulating property of the tunnel insulating film 12 or the isolation insulating film 17.

Setting the thickness of the silicon nitride films 204 and 205 equal to or greater than 0.5 mm enables the inhibition of possible oxygen vacancies due to the reducing agent and the possible formation of a bird's beak at the electrode interface. If the high dielectric constant insulating film 202 contains transition metal, the reducing agent causes many oxygen vacancies. To ensure a sufficient insulating property, the silicon nitride films 204 and 205 desirably have a film thickness of at least 0.8 nm.

If the high dielectric constant insulating film 202 contains transition metal such as Y, Zr, Hf, or La, the catalytic action of the transition metal generates much active oxygen in an oxidation atmosphere during the manufacturing process (for example, an oxidizing step after the formation of the high dielectric constant insulating film 202, an electrode sidewall oxidizing step after processing of the electrode, or the like). This makes it possible to improve the high dielectric constant insulating film 202. Accordingly, the containment of the transition metal is suitable for the case where the inter-electrode insulating film needs to offer excellent insulating characteristics (reduced leakage current, improved breakdown voltage, reduced trapped charge, and the like). In particular, the above improvement is effective when the high dielectric constant insulating film 202 is an oxide. This is expected to be due to the high efficiency with which active oxygen is generated or diffused. As described in the first embodiment, to achieve the effective improvement, the following is preferably satisfied:

$$T/(T+M+S) \geqq 0.2$$

where T is the concentration of the transition metal element in the high dielectric constant insulating film 202 (T>0), M is the concentration of a metal element other than the transition metal element in the high dielectric constant insulating film 202 ($M \geqq 0$), and S is the concentration of a semiconductor element (for example, Si or Ge) in the high dielectric constant insulating film 202 ($S \geqq 0$).

On the other hand, if the high dielectric constant insulating film 202 comprises aluminium oxide or magnesium oxide containing no transition metal, the above catalytic action is suppressed. This makes it possible to prevent the silicon nitride films 204 and 205 from being partly oxidized into silicon oxide films during an electrode sidewall oxidizing step after electrode processing. This in turn inhibits a decrease or variation in the electric capacitance of the inter-electrode insulating film 20. Therefore, if the electric capacitance ratio (coupling ratio) of the inter-electrode insulating film 20 to the tunnel insulating film 12 needs to be controllable, a high dielectric constant insulating film containing no transition metal is desirable.

Figures 14A, 14B:
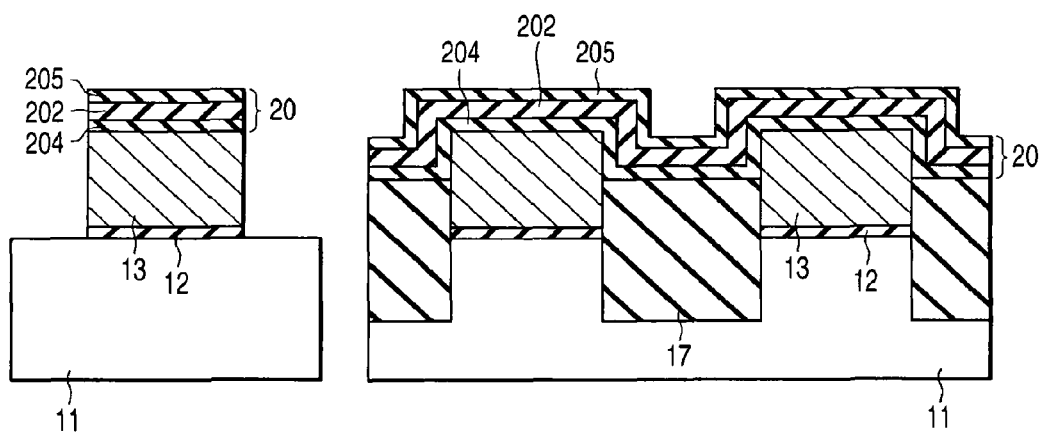
FIGS. 14A and 14B are sectional views schematically showing a part of a process of manufacturing a semiconductor device in accordance with the second embodiment of the present invention in detail.

FIGS. 14A and 14B are sectional views showing in detail a part of the process for manufacturing a semiconductor device shown in FIGS. 1A and 1B to 5A and 5B and 13. FIG. 14A is a sectional view in the bit line direction (channel length direction). FIG. 14B is a sectional view in the word line direction (channel width direction).

After the steps shown in FIGS. 3A and 3B, a lower silicon nitride film 204 of thickness about 0.5 to 10 nm is formed by CVD on the exposed surfaces of the polycrystalline silicon film (floating gate electrode film) 13 and the silicon oxide film (isolation insulating film) 17. A hafnium oxide film as a high dielectric constant insulating film 202 is subsequently formed on the surface of the lower silicon nitride film 204 by ALD (Atomic Layer Deposition). The film thickness of the hafnium oxide film 202 is equal to or greater than that of one atomic layer and equal to or smaller than 5 nm. Further, an upper silicon nitride film 205 of thickness about 0.5 to 10 nm is formed on the surface of the hafnium oxide film 202 by CVD. This results in an inter-electrode insulating film 20 formed of the lower silicon nitride film 204, high dielectric constant insulating film 202, and upper silicon nitride film 205. The subsequent steps are similar to those shown in FIGS. 1A and 1B to 5A and 5B.

With the above manufacturing method, the lower silicon nitride film 204 and upper silicon nitride film 205 are formed by CVD. However, a method such as ALD, thermal nitriding, radical nitriding, or sputtering may be used.

Further, with the above manufacturing method, the high dielectric constant insulating film 202 is formed by ALD. However, a method such as CVD or sputtering may be used. The present manufacturing method desirably uses ALD in order to ensure a uniform film thickness and to inhibit a variation in characteristics among the memory cells.

With the above manufacturing method, the high dielectric constant insulating film 202 formed may be heat-treated at a temperature higher than its formation temperature as described in the first embodiment. The high temperature heat treatment makes it possible to improve the film quality of the high dielectric constant insulating film 202 and increases its density, providing a high dielectric constant insulating film 202 with excellent characteristics.

Although described below in a third embodiment in detail, the lower silicon nitride film 204 formed may be heat-treated at a temperature higher than its formation temperature. The high temperature heat treatment makes it possible to improve the film quality of the lower silicon nitride film 204.

If the high dielectric constant insulating film 202 is formed of metal oxide such as hafnium oxide, it is formed by CVD or ALD using steam (water vapor), which is unlikely to oxidize the silicon nitride film, as oxygen source gas, enabling the inhibition of a decrease in the film thickness of the lower silicon nitride film 204. Thus, steam can be effectively used as oxygen source gas to prevent a possible variation in the electric capacitance of the inter-electrode insulating film 20.

If the high dielectric constant insulating film 202 is formed of metal oxide such as hafnium oxide, it is formed by CVD or ALD using ozone or oxygen radicals, which have high oxidation power, as oxygen source gas. This enables the sufficient oxidation of the interface between the lower silicon nitride film 204 and the high dielectric constant insulating film 202. The interface trap characteristic is thus drastically improved. Therefore, ozone or oxygen radicals can be effectively used as oxygen source gas in order to prevent a possible variation in the threshold for the memory cell caused by the trapping of charge in the inter-electrode insulating film 20.

Embodiment 3

Now, a third embodiment of the present invention will be described. A basic configuration and a basic manufacturing method in accordance with the third embodiment are similar to those in FIGS. 1A and 1B to 5A and 5B for the first embodiment and will not be described in detail. The matters described in the first embodiment will not be described in detail.

FIG. 15 is a sectional view of a nonvolatile semiconductor memory device in accordance with the present embodiment in the bit line direction (channel length direction). Components corresponding to those shown in FIGS. 1A and 1B to 5A and 5B are denoted by the same reference numerals and will not be described in detail.

As shown in FIG. 15, the inter-electrode insulating film 20 is formed of a stack film including the lower silicon nitride film 204, the lower silicon oxide film 201 formed on the lower silicon nitride film 204, the high dielectric constant insulting film (intermediate insulating film) 202 formed on the lower silicon oxide film 201, the upper silicon oxide film 203 formed on the high dielectric constant insulating film 202, and the upper silicon nitride film 205 formed on the upper silicon oxide film 203. The high dielectric constant insulating film 202 contains at least a metal element and has a relative dielectric constant greater than 7. That is, the high dielectric constant insulating film 202 has a relative dielectric constant greater than that (about 7) of a typical silicon nitride film ($Si_3N_4$). The high dielectric constant insulating film 202 preferably contains oxygen in addition to a metal element.

As described above, the inter-electrode insulating film 20 has the stack structure including the lower silicon nitride film 204, lower silicon oxide film 201, high dielectric constant insulating film 202, upper silicon oxide film 203, and upper silicon nitride film 205. This structure enables the simultaneous exertion of the effects described in the first and second embodiments (the supply of the oxidizer to the high dielectric constant insulating film 202, the inhibition of diffusion of the reducing agent to the high dielectric constant insulating film 202, the inhibition of formation of a bird's beak, and the like).

The lower silicon nitride film 204 provided under the lower silicon oxide film 201 enables the prevention of possible disadvantageous formation of a new silicon oxide layer on the surface of the floating gate electrode 13 as a result of the step of forming silicon oxide films 201 and 203 and a high dielectric constant insulating film 202 or the oxidation atmosphere step for improving the silicon oxide films 201 and 203 and high dielectric constant insulating film 202. This allows the prevention of a possible increase or variation in the electric capacitance of the inter-electrode insulating film 20. Further, a more sufficient oxidizing process can be executed in the step of forming silicon oxide films 201 and 203 and a high dielectric constant insulating film 202 or the oxidation atmosphere step for improving the silicon oxide films 201 and 203 and high dielectric constant insulating film 202. The insulating property of the inter-electrode insulating film 20 can thus be improved.

Furthermore, the upper silicon nitride film 205 provided over the upper silicon oxide film 203 enables the prevention of possible detachment of oxygen from the high dielectric constant insulating film 202 through the upper silicon oxide film 203. This also enables the prevention of possible, disadvantageous formation of a new silicon oxide layer at the interface of the control electrode 21 as a result of the detachment of oxygen from the upper silicon oxide film 203 or high dielectric constant insulating film 202. This in turn allows the prevention of a possible, disadvantageous increase in the electric capacitance of the inter-electrode insulating film.

Further, since all the three layers, that is, the lower silicon oxide film 201, high dielectric constant insulating film 202, and upper silicon oxide film 203, are formed of an oxide, the oxidizer can be allowed to simultaneously permeate all the three layers. That is, to improve the characteristics of the inter-electrode insulating film, it is important to compensate for oxygen vacancies occurring during film formation. A treatment for oxygen supply after the formation of the three layers enables all the three layers to be simultaneously improved. In contrast, if the inter-electrode insulating film is formed of three layers, a silicon oxide film, a silicon nitride film, and a silicon oxide film, the silicon nitride film functions as an oxygen diffusion barrier. Thus, to improve the quality of the lower and upper silicon oxide films, an oxidizing process for improvement needs to be executed after the formation of a lower silicon oxide film and the formation of an upper silicon oxide film. Further, since a silicon nitride film is formed after the oxidation and improvement of the lower silicon oxide film, damage disadvantageously cannot be completely be eliminated from the lower silicon oxide film after the formation of a silicon nitride film. The present embodiment can reliably prevent such a problem.

FIGS. 16A and 16B are sectional views showing in detail a part of the process for manufacturing a semiconductor device shown in FIGS. 1A and 1B to 5A and 5B and 15. FIG. 16A is a sectional view in the bit line direction (channel length direction). FIG. 16B is a sectional view in the word line direction (channel width direction).

After the steps shown in FIGS. 3A and 3B, a lower silicon nitride film 204 of thickness about 0.5 to 10 nm is formed by radical nitriding on the exposed surfaces of the polycrystalline silicon film (floating gate electrode film) 13 and the silicon oxide film (isolation insulating film) 17. A lower silicon oxide film 201 of thickness 1 to 5 nm is subsequently formed by CVD on the surface of the lower silicon nitride film 204. A hafnium aluminate (HfAlO) film as a high dielectric constant insulating film 202 is subsequently formed on the surface of the lower silicon oxide film 201 by ALD (Atomic Layer Deposition). The film thickness of the hafnium aluminate film 202 is equal to or greater than that of one atomic layer and equal to or smaller than 5 nm. An upper silicon oxide film 203 of thickness 1 to 5 nm is subsequently formed on the surface of the hafnium aluminate film 202 by CVD. Further, an upper silicon nitride film 205 of thickness about 0.5 to 10 nm is formed on the upper silicon oxide film 203 by CVD. This results in an inter-electrode insulating film 20 formed of the lower silicon nitride film 204, lower silicon oxide film 201, high dielectric constant insulating film 202, upper silicon oxide film 203, and upper silicon nitride film 205. The subsequent steps are similar to those shown in FIGS. 1A and 1B to 5A and 5B.

With the above manufacturing method, the lower silicon nitride film 204, lower silicon oxide film 201, high dielectric constant insulating film 202, upper silicon oxide film 203, and upper silicon nitride film 205 can be formed by any of various methods including CVD, ALD, thermal nitriding, radical nitriding, and sputtering.

Further, with the above manufacturing method, the high dielectric constant insulating film 202 is formed by ALD. However, a method such as CVD or sputtering may be used. The present manufacturing method desirably uses ALD in order to ensure a uniform film thickness and to inhibit a variation in characteristics among the memory cells.

With the above manufacturing method, the high dielectric constant insulating film 202 formed may be heat-treated at a temperature higher than its formation temperature as described in the first embodiment. The high temperature heat treatment makes it possible to improve the film quality of the high dielectric constant insulating film 202 and increases its density, providing a high dielectric constant insulating film 202 with excellent characteristics.

Further, the lower silicon nitride film 204 formed may be heat-treated at a temperature higher than its formation temperature. The high temperature heat treatment makes it possible to improve the film quality of the lower silicon nitride film 204.

The desirable film formation temperature of the lower silicon oxide film 201 is at most 600° C. This makes it possible to sharply reduce nitrogen detached from the lower silicon nitride film 204. This in turn enables the prevention of a possible decrease in the dielectric constant of the lower silicon nitride film 204. It is also possible to prevent the possible oxidation of a bird's beak at the interface between the floating gate electrode 13 and the lower silicon nitride film 204 caused by active oxygen generated by the catalytic effect of the metal element in the high dielectric constant insulating film 202.

Further, the desired film formation temperature of the upper silicon oxide film 203 is at most 600° C. This makes it possible to sharply reduce oxygen detached from the high dielectric constant insulating film 202. This in turn enables the inhibition of possible formation of a charge trap level or a leakage current path in the high dielectric constant insulating film 202. It is therefore possible to further reduce the leakage current of the inter-electrode insulating film 20 and a variation in the threshold for the memory cell caused by charge trapping.

Methods for forming silicon oxide films 201 and 203 at most 600° C. include, for example, ALD using TDMAS (tri-dimethylaminosilane) ($SiH[N(CH_3)_2]_3$)) and ozone gas or oxygen radicals as source gas and ALD using BTBAS (bi-tertialy butylamino silane) ($SiH_2N[C(CH_3)_3]_2$)) and ozone gas or oxygen radicals as source gas. Alternatively, the silicon oxide films 201 and 203 can be formed by sputtering in an atmosphere containing oxygen, using silicon or silicon oxide as a target material. Effects similar to those described above can also be exerted by using any other method provided that the silicon oxide films 201 and 203 are formed at most 600° C.

Description will be given below of a step of forming a lower silicon nitride film 204 by radical nitriding and a step of forming a lower silicon nitride film 204 and then performing a heat treatment at a temperature higher than the formation temperature of the lower silicon nitride film 204.

For example, conditions for the radical nitriding include a high frequency power of at least 500 W, a pressure of between several tens of mTorr and 10 Torr, a nitriding treatment temperature of between the room temperature and 800° C., and a nitriding treatment time of between 5 and 600 seconds.

A lower silicon nitride film 204 is formed by radical nitriding and then heat-treated at a temperature higher than its formation temperature. The heat treatment enables an increase in the density of the lower silicon nitride film 204. Further, an incomplete Si—N bond can be converted into a complete Si—N bond. Therefore, the heat treatment enables the improvement of film quality of the lower silicon nitride film 204 and of the device characteristics.

FIG. 32 is a diagram showing the effects of the heat treatment. Thermal treatment temperature is 1,000° C., and heat treatment time is 30 seconds. As shown in FIG. 32, the heat treatment after the formation of a lower silicon nitride film corrects a variation in threshold. This is because the heat treatment improves the film quality of the lower silicon nitride film and reduces the leakage current during charge retention as well as the level of trapping.

Thus, the heat treatment enables an increase in the density of the lower silicon nitride film 204. This allows the inhibition of possible emission of nitrogen from the lower silicon nitride film 204, reducing the fixed charge in the memory cell.

In order to inhibit a possible increase in the electrical film thickness of the lower silicon nitride film 204, the above heat treatment is preferably performed in an inert gas atmosphere. In order to improve the characteristics of the interface between the lower silicon nitride film 204 and the upper insulating film, the above heat treatment is preferably performed in an oxidizing atmosphere.

The heat treatment may be performed at a temperature higher than the formation temperature of the lower silicon nitride film 204. However, to exert sufficient effects, the heat treatment is preferably performed at least 900° C. FIG. 33 is a diagram showing the relationship between the heat treatment temperature and a low electric field leakage current.

As shown in FIG. 33, a heat treatment at least 900° C. enables a reduction in low electric field leakage current.

In the above example, the lower silicon nitride film 204 is formed by radical nitriding. However, the lower silicon nitride film 204 may be formed by low pressure CVD or ALD.

Description will be given of the formation of a high dielectric constant insulating film 202 by CVD or ALD using ozone as oxygen source gas (oxidizer). Specifically, a hafnium aluminium oxide (hafnium aluminate: HfAlO) film is formed by ALD using ozone ($O_3$) as a oxygen source and diethyl aminohafnium ($Hf(NC_2H_5)_4$) as a hafnium source. To form a hafnium aluminium oxide film, the pressure is set at most 50 Torr and the temperature is set at about 275° C.

The use of ozone ($O_3$) as an oxygen source for the hafnium aluminium oxide film enables a reduction in the fixed charge in the memory cell as shown in FIG. 28 for the first embodiment. This is expected to be because the use of ozone as an oxygen source enables a reduction in carbon emitted from the hafnium aluminium oxide film during a subsequent thermal step. Reduction of the amount of oxidizer emitted from the hafnium aluminium oxide film is expected to be a factor of reducing fixed charges. The oxidizer emitted from the hafnium aluminium oxide film increases the amount of nitrogen emitted from the lower silicon nitride film and thus the amount of fixed charge in the memory cell. The fixed charge may vary the threshold for the memory cell. Therefore, the use of ozone as an oxygen source makes it possible to improve the device characteristics.

The hafnium source used to form a hafnium aluminium oxide film is not limited to diethyl aminohafnium (Hf $(NC_2H_5)_4$). For example, the hafnium source may be obtained by changing the ethyl group of diethyl aminohafnium to other alkyl group. Alternatively, the hafnium source may be obtained by changing the ethyl group of diethyl aminohafnium to an alkoxide group.

The film formation temperature of the hafnium aluminium oxide film is preferably at most 300° C. Setting the film formation temperature of the hafnium aluminium oxide film higher than 300° C. may significantly degrade the surface morphology of the hafnium aluminium oxide film. Setting the film formation temperature of the hafnium aluminium oxide film higher than 300° C. forms grains at the surface of the hafnium aluminium oxide film. The density of grains increases consistently with the film formation temperature. On the other hand, no grains were obtained at the surface of the hafnium aluminium oxide film when the film formation temperature of the hafnium aluminium oxide film is set at 290° C. Therefore, the film formation temperature of the hafnium aluminium oxide film is preferably at most 300° C.

Further, the film formation temperature of the hafnium aluminium oxide film is preferably at least 175° C. As already shown in FIG. 30, setting the film formation temperature of the hafnium aluminium oxide film lower than 175° C. increases the magnitude of the Vfb shift, that is, the amount of fixed charge. Therefore, the film formation temperature of the hafnium aluminium oxide film is preferably at least 175° C.

In the formation of a hafnium aluminium oxide film, effects similar to those described above can be exerted by using oxygen radicals as an oxygen source in place of ozone.

As already described, to improve the film quality of the high dielectric constant insulating film (hafnium aluminium oxide film) 202 and increases its density, the high dielectric constant insulating film 202 formed is preferably heat-treated at a temperature higher than its formation temperature. This makes it possible to, for example, reduce the leakage current, improve the resistance to chemicals, and inhibit possible defects (oxygen vacancies and metal vacancies) in the hafnium aluminium oxide film during the thermal step. The heat treatment may be performed in an inert gas atmosphere or in an oxidizing gas atmosphere. To inhibit possible oxygen vacancies during the thermal step, the oxidizing atmosphere is preferably used. To inhibit a possible increase in film thickness resulting from the heat treatment, the inert gas atmosphere is preferably used.

The temperature of the heat treatment after the formation of a hafnium aluminium oxide film is preferably at least 900° C. as already shown in FIG. 31. A heat treatment temperature of at least 900° C. enables etching resistance to be significantly improved. This makes it possible to inhibit a possible variation in the amount of side etching of the high dielectric constant insulating film and a possible variation in the coupling ratio (C2/(C1+C2)) of the memory cell. Further, the large side etching amount of the high dielectric constant insulating film increases the amount of high electric field leakage, degrading the programming/erasing characteristic of the memory cell. The above high temperature thermal process enables the etching resistance to be significantly improved, allowing the prevention of the above problems.

In the above second and third embodiments, a very thin silicon oxide film may be formed on at least one of the bottom surface of the lower silicon nitride film 204 and the top surface of the upper silicon nitride film 205. In this case, the film thickness of the very thin silicon oxide film is desirably small but enough to minimize the formation of a bird's beak. For example, the film thickness of the silicon oxide film is desirably smaller than 1 nm. The formation of such a silicon oxide film makes it possible to provide a favorable interface between the lower silicon nitride film 204 and the floating gate electrode 13 and between the upper silicon nitride film 205 and the control electrode 21. This is because the formation of a silicon oxide film between the silicon nitride film and the polycrystalline silicon electrode enables a reduction in interface state and allows the inhibition of a flat band voltage shift caused by fixed charge attributed to the silicon nitride film. The favorable interface formed reduces low electric field leakage, allowing the charge retention characteristic of the element to be improved.

Further, in the above first and third embodiments, the lower silicon oxide film 201 and upper silicon oxide film 203 may be formed of silicon oxinitride films containing nitrogen. In the above second and third embodiments, the lower silicon nitride film 204 and upper silicon nitride film 205 may be formed of silicon oxinitride films containing oxygen.

Embodiment 4

A fourth embodiment of the present invention will be described below. The matters described in the first to third embodiments will not be described in detail.

The present embodiment corresponds to any of the configurations of the first to third embodiments in which the high dielectric constant insulating film 202 contains carbon. Specifically, carbon is introduced, by ion implantation, into the high dielectric constant insulating film 202 formed. At this time, dose and acceleration energy are adjusted so that the concentration of carbon in the high dielectric constant insulating film 202 is at least $1 \times 10^{19}$ atoms/cm$^3$ and at most $2 \times 10^{22}$ atoms/cm$^3$. Any method other than ion implantation may be used provided that the concentration of carbon in the high dielectric constant insulating film 202 can be controlled to the above values.

When the concentration of carbon in the high dielectric constant insulating film 202 is at least $1 \times 10^{19}$ atoms/cm$^3$ and at most $2 \times 10^{22}$ atoms/cm$^3$ as described above, the insulating property of the high dielectric constant insulating film is inhibited from being degraded when silicon oxide films or silicon nitride films are formed. A constituent element of the high dielectric constant insulating film such as oxygen may be detached from the film owing to a reducing atmosphere containing hydrogen, a halogen atmosphere containing chlorine, or high temperature annealing; the reducing atmosphere and halogen atmosphere are used to form silicon oxide films and silicon nitride films. The containment of carbon is expected to inhibit the possible detachment of the constituent element and the possible degradation of the insulting property of the high dielectric constant insulating film.

FIG. 17 is a diagram showing the relationship between the concentration of carbon in the high dielectric constant insulating film and the leakage current density. Although hafnium aluminate (HfAlO) is used for the high dielectric constant insulating film, similar characteristics are obtained by using aluminium oxide (alumina: $Al_2O_3$). Samples for measurement were obtained by introducing carbon into the high dielectric constant insulating film by ion implantation and performing heat treatment at 1,050° C. FIG. 17 shows that the leakage current increases rapidly when the concentration of carbon in the high dielectric constant insulating film exceeds $2 \times 10^{22}$ atoms/cm$^3$.

FIG. 18 is a diagram showing the relationship between the concentration of carbon in the high dielectric constant insulating film and the etching rate of the high dielectric constant insulating film based on RIE. FIG. 18 shows that the etching rate increases rapidly when the concentration of carbon in the high dielectric constant insulating film is at least $1 \times 10^{19}$ atoms/cm$^3$. This is because the containment of carbon in the high dielectric constant insulating film at the above described concentration reduces the film density and increases the RIE rate.

As described above, measurements in FIGS. 17 and 18 also indicate that the concentration of carbon in the high dielectric constant insulating film 202 is desirably at least $1 \times 10^{19}$ atoms/cm$^3$ and at most $2 \times 10^{22}$ atoms/cm$^3$.

Further, if the high dielectric constant insulating film contains hafnium, its melting point is increased, which preventing the insulating property of the inter-electrode insulating film from being degraded in high temperature steps.

The containment of carbon in the entire high dielectric constant insulating film within the above concentration range makes the effects of the present embodiment significant. However, even the containment of carbon in part of the high dielectric constant insulating film within the above concentration range allows certain effects to be exerted.

Furthermore, the formation of a high dielectric constant insulating film by sputtering enables a sufficient reduction in the concentration of carbon in the high dielectric constant insulating film. This makes it possible to precisely control the concentration of carbon in the final high dielectric constant insulating film.

Embodiment 5

A fifth embodiment of the present invention will be described below. The matters described in the first to third embodiments will not be described in detail.

The present embodiment corresponds to any of the configurations of the first to third embodiments in which the high dielectric constant insulating film 202 contains nitrogen. Specifically, nitrogen is introduced, by ion implantation, into the high dielectric constant insulating film 202 formed. At this time, dose and acceleration energy are adjusted so that the concentration of nitrogen in the high dielectric constant insulating film 202 is at least $1 \times 10^{19}$ atoms/cm$^3$ and at most $2 \times 10^{22}$ atoms/cm$^3$. Any method other than ion implantation may be used provided that the concentration of nitrogen in the high dielectric constant insulating film 202 can be controlled to the above values.

When the concentration of nitrogen in the high dielectric constant insulating film 202 is at least $1 \times 10^{19}$ atoms/cm$^3$ and at most $2 \times 10^{22}$ atoms/cm$^3$ as described above, the insulating property of the high dielectric constant insulating film is inhibited from being degraded when silicon oxide films or silicon nitride films are formed. A constituent element of the high dielectric constant insulating film such as oxygen may be detached from the film owing to a reducing atmosphere containing hydrogen, a halogen atmosphere containing chlorine, or high temperature annealing; the reducing atmosphere and halogen atmosphere are used to form silicon oxide films and silicon nitride films. The containment of nitrogen is expected to inhibit the possible detachment of the constituent element and the possible degradation of the insulting property of the high dielectric constant insulating film.

Figure 19:
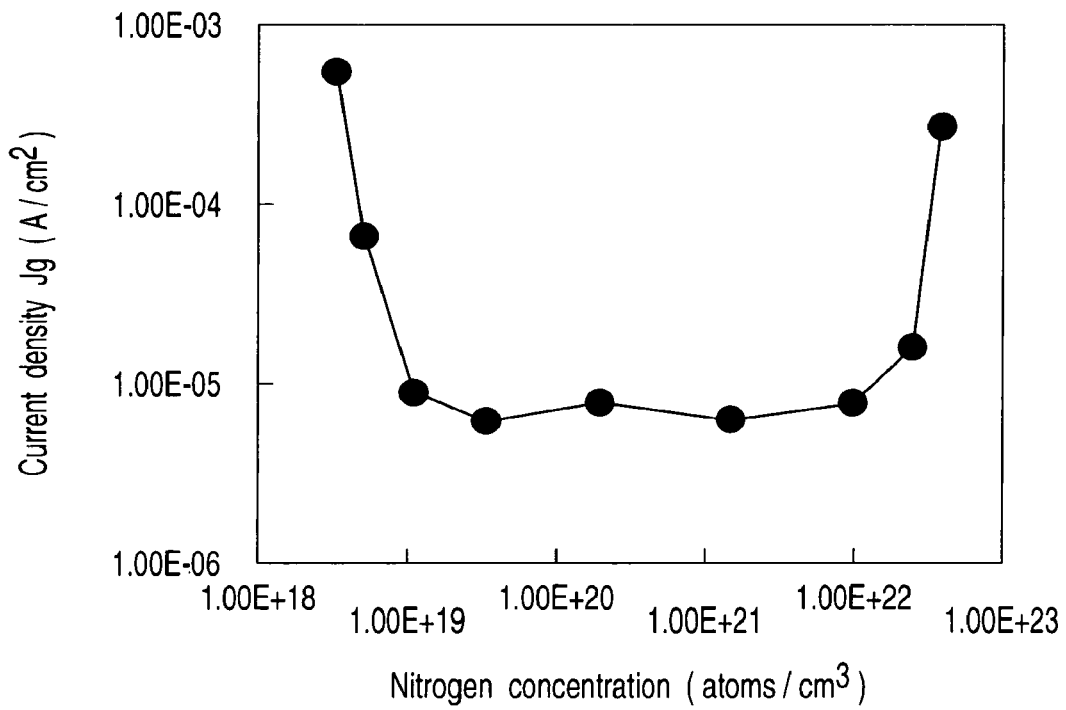
FIG. 19 is a diagram showing the relationship between the concentration of nitrogen in the high dielectric constant insulating film and the leakage current density in accordance with a fifth embodiment of the present invention.

FIG. 19 is a diagram showing the relationship between the concentration of nitrogen in the high dielectric constant insulating film and the leakage current density. Although hafnium aluminate (HfAlO) is used for the high dielectric constant insulating film, similar characteristics are obtained by using aluminium oxide (alumina: $Al_2O_3$). Samples for measurement were obtained by introducing nitrogen into the high dielectric constant insulating film by ion implantation. FIG. 19 shows that the leakage current can be inhibited when the concentration of nitrogen in the high dielectric constant insulating film is at least $1 \times 10^{19}$ atoms/cm$^3$ and at most $2 \times 10^{22}$ atoms/cm$^3$. This is because setting the concentration of nitrogen in the high dielectric constant insulating film within the above range makes it possible to effectively inhibit the detachment of a constituent element of the high dielectric constant insulating film such as oxygen.

Figure 20:
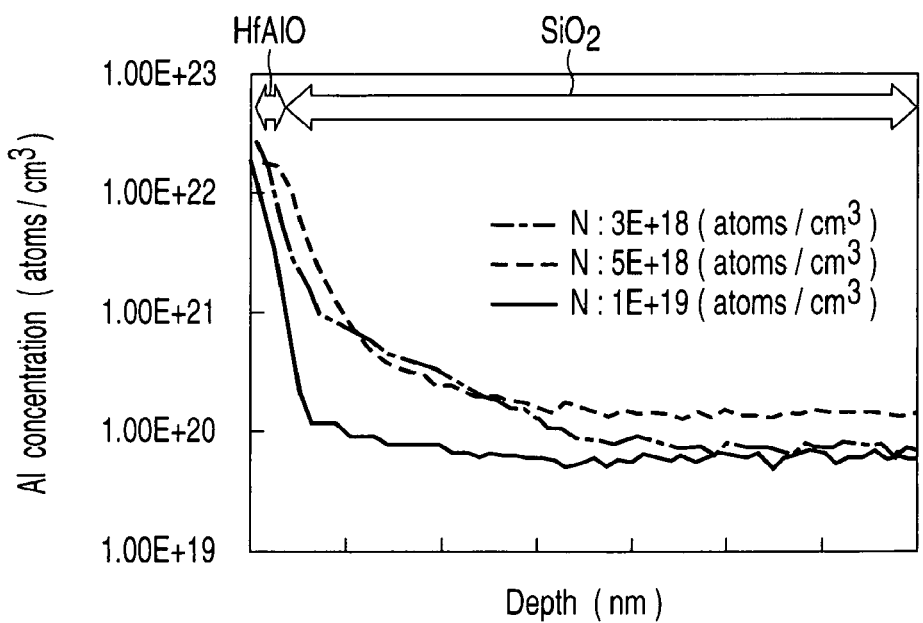
FIG. 20 is a diagram showing the distribution of concentration of aluminium in a depth direction in accordance with the fifth embodiment of the present invention.

FIG. 20 is a diagram showing the measurement of the distribution of the concentration of aluminium (Al) in a depth direction. Although hafnium aluminate (HfAlO) is used for the high dielectric constant insulating film, similar characteristics are obtained by using aluminium oxide (alumina: $Al_2O_3$). Samples for measurement were obtained by forming a silicon oxide film on a silicon substrate, forming a high dielectric constant insulating film, and performing heat treatment at 1,000° C. for 10 seconds. SIMS analysis was used for the measurement. FIG. 20 shows that when the concentration of nitrogen in the high dielectric constant insulating film is lower than $1 \times 10^{19}$ atoms/cm$^3$, Al in the HfAlO film diffuses significantly into the silicon oxide film ($SiO_2$ film). This markedly varies the Hf/Al ratio of the HfAlO film. In contrast, at a nitrogen concentration of $1 \times 10^{19}$ atoms/cm$^3$, Al in the HfAlO film does not virtually diffuse into the silicon oxide film. Consequently, setting the concentration of nitrogen in the high dielectric constant insulating film equal to or greater than $1 \times 10^{19}$ atoms/cm$^3$ enables the Hf/Al ratio of the HfAlO film to be adequately controlled.

The containment of nitrogen in the entire high dielectric constant insulating film within the above concentration range makes the effects of the present embodiment significant. However, even the containment of nitrogen in part of the high dielectric constant insulating film within the above concentration range allows certain effects to be exerted.

Furthermore, the formation of a high dielectric constant insulating film by sputtering enables a sufficient reduction in the concentration of nitrogen in the resulting high dielectric constant insulating film. This makes it possible to precisely control the concentration of nitrogen in the final high dielectric constant insulating film.

Embodiment 6

A sixth embodiment of the present invention will be described below. The matters described in the first to third embodiments will not be described in detail.

The present embodiment corresponds to any of the configurations of the first to third embodiments in which the high dielectric constant insulating film 202 contains hydrogen. Specifically, hydrogen is introduced into the formed high dielectric constant insulating film 202 by heat-treating it in a hydrogen gas atmosphere at 100 to 550° C. At this time, heat treatment temperature, heat treatment time, and hydrogen gas partial pressure are adjusted so that the concentration of hydrogen in the high dielectric constant insulating film 202 is at least $1\times10^{19}$ atoms/cm$^3$ and at most $5\times10^{22}$ atoms/cm$^3$. Any method other than the heat treatment in the hydrogen atmosphere may be used provided that the concentration of hydrogen in the high dielectric constant insulating film 202 can be controlled to the above values.

When the concentration of hydrogen in the high dielectric constant insulating film 202 is at least $1\times10^{19}$ atoms/cm$^3$ and at most $5\times10^{22}$ atoms/cm$^3$ as described above, a sufficient amount of hydrogen can be supplied to the silicon oxide films 201 and 203, the silicon nitride films 204 and 205, and the interface of the insulating film contained in the inter-electrode insulating film of the stack structure, during the high temperature step in manufacturing process. This improves the insulating property of the inter-electrode insulating film.

FIG. 21 is a diagram showing the relationship between the concentration of hydrogen in the high dielectric constant insulating film and the leakage current density. Although hafnium aluminate (HfAlO) is used for the high dielectric constant insulating film, similar characteristics are obtained by using aluminium oxide (alumina: $Al_2O_3$). Samples for measurement were obtained by heat-treating the formed high dielectric constant insulating film in a hydrogen gas atmosphere. FIG. 21 shows that the leakage current can be inhibited when the concentration of hydrogen in the high dielectric constant insulating film is at least $1\times10^{19}$ atoms/cm$^3$ and at most $5\times10^{22}$ atoms/cm$^3$. This is because setting the concentration of hydrogen in the high dielectric constant insulating film within the above range makes it possible to supply a sufficient amount of hydrogen to the silicon oxide films and silicon nitride films and to effectively terminate the interface level at hydrogen. A hydrogen concentration of higher than $5\times10^{22}$ atoms/cm$^3$ reduces the film density and degrades the insulating property, increasing the amount of leakage current.

FIG. 22 is a diagram showing measurements of electric capacitance. FIG. 22 shows that the interface level increases when the concentration of hydrogen in the high dielectric constant insulating film is lower than $1\times10^{19}$ atoms/cm$^3$.

The containment of hydrogen in the entire high dielectric constant insulating film within the above concentration range makes the effects of the present embodiment significant. However, even the containment of hydrogen in part of the high dielectric constant insulating film within the above concentration range allows certain effects to be exerted.

Furthermore, the formation of a high dielectric constant insulating film by sputtering enables a sufficient reduction in the concentration of hydrogen in the resulting high dielectric constant insulating film. This makes it possible to precisely control the concentration of hydrogen in the final high dielectric constant insulating film.

Embodiment 7

A seventh embodiment of the present invention will be described below. The matters described in the above embodiments will not be described in detail.

In the present embodiment, a high dielectric constant insulating film 202 containing carbon, nitrogen, or hydrogen is formed by CVD or ALD using a source gas containing carbon, nitrogen, or hydrogen. The concentration of carbon, nitrogen, or hydrogen in the high dielectric constant insulating film 202 is as described above in the fourth to sixth embodiments. The concentration of the element can be appropriately controlled on the basis of the type or partial pressure of the source gas or the film formation temperature.

For example, any of the source gases listed below is used to form a hafnium aluminate (HfAlO) as a high dielectric constant insulating film.

Examples of hafnium source gas include tetrakis dimethyl amino hafnium ($Hf[N(CH_3)_2]_4$), tetrakis diethyl amino hafnium ($Hf[N(C_2H_5)_2]_4$), tetrakis ethylmethyl amino hafnium ($Hf[N(C_2H_5)(CH_3)]_4$), tetra methoxy hafnium ($Hf(OCH_3)_4$), tetra-i-propoxy hafnium ($Hf(O-i-C_3H_7)_4$), and tetrakis (dipivaloylmethanato) hafnium ($Hf(C_{11}H_{19}O_2)_4$). Examples of aluminium source gas include trimethyl aluminium ($Al(CH_3)_3$), triethyl aluminium ($Al(C_2H_5)_3$), tris (sec-butoxy) aluminium ($Al(O-sec-C_4H_9)_3$), tri-methoxy aluminium ($Al(OCH_3)_3$), and tri-ethoxy aluminium ($Al(OC_2H_5)_3$). Examples of oxygen source gas include oxygen gas, ozone, steam (water vapor), and oxygen radicals.

Any of these source gases allows at least one of carbon, nitrogen, and hydrogen to be added to the high dielectric constant insulating film during the film forming process. Selection of an appropriate source gas allows carbon, nitrogen, and hydrogen to be simultaneously added. Selection of an appropriate source gas and appropriate film formation conditions allows carbon, nitrogen, and hydrogen to be simultaneously added at the above desirable element concentrations.

Embodiment 8

An eighth embodiment of the present invention will be described below. The matters described in the above embodiments will not be described in detail.

FIG. 23 is a sectional view schematically showing the detailed configuration of a nonvolatile semiconductor memory device in accordance with the present embodiment in the word line direction (channel width direction). Components corresponding to those shown in FIGS. 1A and 1B to 5A and 5B are denoted by the same reference numerals and will not be described in detail.

In the present embodiment, the inter-electrode insulating film 20 has a first portion 20a formed along the top surface of the floating gate electrode 13, a second portion 20b formed along the side surfaces of the floating gate electrode 13, and a third portion 20c formed between the adjacent floating gate electrodes 13. The third portion 20c has a lower oxygen concentration than the first portion 20a.

Thus, in the present embodiment, the third portion 20c, formed between the adjacent floating gate electrodes 13, has a lower oxygen concentration. The third portion 20c, having the lower oxygen concentration, offers a reduced dielectric constant. This reduces the parasitic capacitance between the adjacent floating gate electrodes 13, allowing possible memory malfunctions to be avoided. On the other hand, the first portion 20a, formed along the top surface of the floating gate electrode 13, has a higher oxygen concentration and can thus provide a large electric capacitance desirable for the inter-electrode insulating film. Therefore, nonvolatile semiconductor memory device having excellent characteristic and reliability can be obtained.

In the present embodiment, the inter-electrode insulating film 20 may have such a stack structure as shown in any of the first to third embodiments or a single layer structure formed of the high dielectric constant insulating film. The above effects can be exerted regardless of whether the inter-electrode insulating film 20 has a stack structure containing the high dielectric constant insulating film or a single layer structure formed of the high dielectric constant insulating film.

The structure of the above present embodiment is obtained by forming a high dielectric constant insulating film by means of CVD or ALD using ozone or oxygen radicals as oxygen source gas. That is, the narrow groove between the adjacent floating gate electrodes 13 inactivates ozone or oxygen radicals, which have a short lifetime. This reduces the ozone or oxygen radicals reaching the surface of the isolation insulating film 17. On the other hand, ozone or oxygen radicals are likely to reach the top surface of the floating gate electrode 13 owing to its projection. This makes it possible to provide the structure of the above present embodiment.

Further, as shown in FIG. 24, after a high dielectric constant insulating film is formed as the inter-electrode insulating film 20, oxygen may be introduced into the high dielectric constant insulating film by oblique ion implantation. This method also makes it possible to provide the structure of the above present embodiment. In this case, the oxygen concentration is high in the first portion 20a, extending along the top surface of the floating gate electrode 13, and low in the third portion 20c, extending along the top surface of the isolation insulating film 17. The oxygen concentration in the second portion 20b, extending along the side surfaces of the floating gate electrode 13, is intermediate between that in the first portion 20a and that in the third portion 20c.

Embodiment 9

A ninth embodiment of the present invention will be described below. The matters described in the above embodiments will not be described in detail.

In the present embodiment, the inter-electrode insulating film 20 is formed of the lower silicon oxide film 201, high dielectric constant insulating film 202, and upper silicon oxide film 203 as is the case with the first embodiment. However, in the present embodiment, at least one of the lower silicon oxide film 201 and upper silicon oxide film 203 contains at least one of carbon, nitrogen, and chlorine at a peak concentration of at least $1 \times 10^{19}$ atoms/cm$^3$.

The high dielectric constant insulating film 202 formed by normal CVD or ALD contains an impurity element (carbon, nitrogen, or chlorine) contained in the source gas, for example, at a peak concentration of at least $1 \times 10^{19}$ atoms/cm$^3$. For example, during the formation of a high dielectric constant insulating film 202 by deposition, the use of an organic metal material as source gas allows the resulting high dielectric constant insulating film 202 to contain carbon. The use of source gas containing nitrogen allows the resulting high dielectric constant insulating film 202 to contain nitrogen. The use of source gas containing chlorine allows the resulting high dielectric constant insulating film 202 to contain chlorine. In forming a stack film of the lower silicon oxide film 201, high dielectric constant insulating film 202, and upper silicon oxide film 203, impurities the same as those contained in the high dielectric constant insulating film 202 are doped into at least one of the lower silicon oxide film 201 and upper silicon oxide film 203 at a peak concentration of at least $1 \times 10^{19}$ atoms/cm$^3$. This makes it possible to inhibit the impurities from diffusing between the lower silicon oxide film 201 and the high dielectric constant insulating film 202 and the upper silicon oxide film 203. In particular, the impurities are inhibited from diffusing from the high dielectric constant insulating film 202 to the lower silicon oxide film 201 and upper silicon oxide film 203. This makes it possible to drastically improve the thermostability of the stack film of the lower silicon oxide film 201, high dielectric constant insulating film 202, and upper silicon oxide film 203. As a result, an inter-electrode insulating film with an excellent insulating property can be provided.

In addition to exerting the above effect, the present embodiment can produce effects described below by doping the respective impurity elements.

When at least one of the lower silicon oxide film 201 and upper silicon oxide film 203 contains nitrogen, its thermostability is drastically improved. This makes it possible to significantly improve the insulating property of the stack structure of the lower silicon oxide film 201, high dielectric constant insulating film 202, and upper silicon oxide film 203. Further, when nitrogen is contained in the lower silicon oxide film 201 or upper silicon oxide film 203, the lower silicon oxide film 201 or upper silicon oxide film 203 serves as a diffusion source for nitrogen. The subsequent high temperature thermal step of the manufacturing process diffuses the nitrogen into the high dielectric constant insulating film 202. This enables the thermostability of the high dielectric constant insulating film 202 to be improved. Moreover, when a high dielectric constant insulating film 202 is formed of an oxide, the dielectric constant of the high dielectric constant insulating film 202 increases.

When at least one of the lower silicon oxide film 201 and upper silicon oxide film 203 contains chlorine, the gettering effect of chlorine is exerted. This makes it possible to inhibit the disadvantageous, possible diffusion of the metal element constituting the high dielectric constant insulating film 202 into the tunnel insulating film 12 through the floating gate electrode 13, degrading the film quality of the tunnel insulating film 12. Even if the metal element constituting the high dielectric constant insulating film 202 diffuses into the lower silicon oxide film 201 or upper silicon oxide film 203, the gettering effect of chlorine enables the metal element to be electrically inactivated. This makes it possible to inhibit the possible degradation of the insulating property of the lower silicon oxide film 201 and upper silicon oxide film 203.

Figure 25:
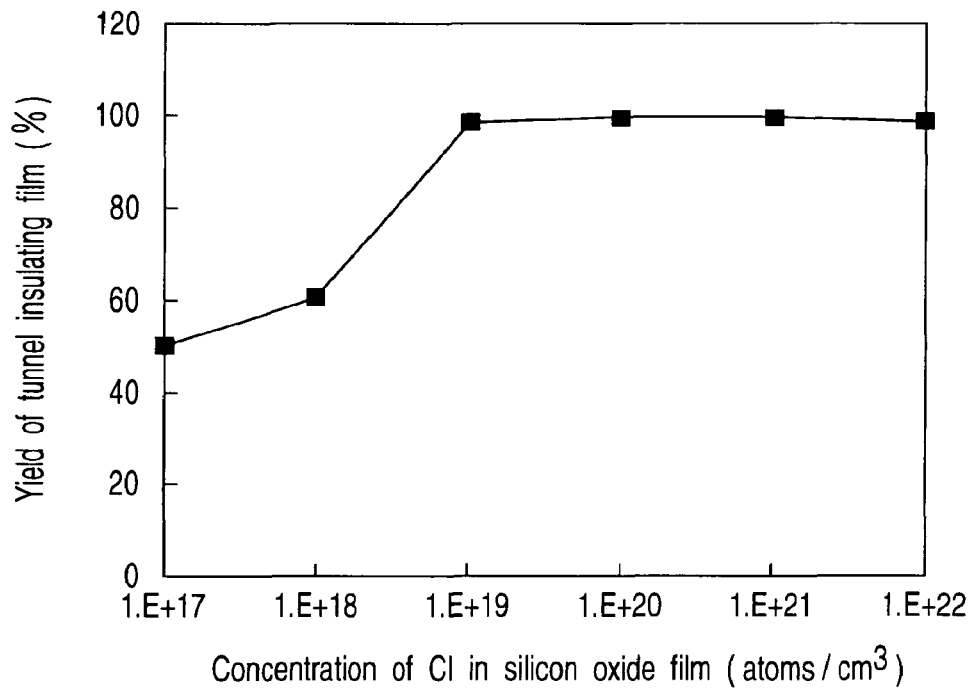
FIG. 25 is a diagram showing the relationship between the concentration of chlorine in a silicon oxide film and the yield of a tunnel insulating film in accordance with a ninth embodiment of the present invention.

FIG. 25 is a diagram showing the relationship between the concentration of chlorine (Cl) in the silicon oxide film and the yield of the tunnel insulating film. The chlorine concentration was measured by SIMS. The yield indicates the rate of cells with the tunnel insulating film prevented from being broken down after one hundred thousand programming operations. As is apparent from FIG. 25, at least $1 \times 10^{19}$ atoms/cm$^3$ of chlorine in the silicon oxide film allows the yield of the tunnel insulating film to be drastically improved.

If at least one of the lower silicon oxide film 201 and upper silicon oxide film 203 contains carbon, carbon can be fed from the silicon oxide film to the high dielectric constant insulating film 202. This enables the charge trap level in the high dielectric constant insulating film 202 to be terminated, allowing the high dielectric constant insulating film 202 to be improved.

Figure 26:
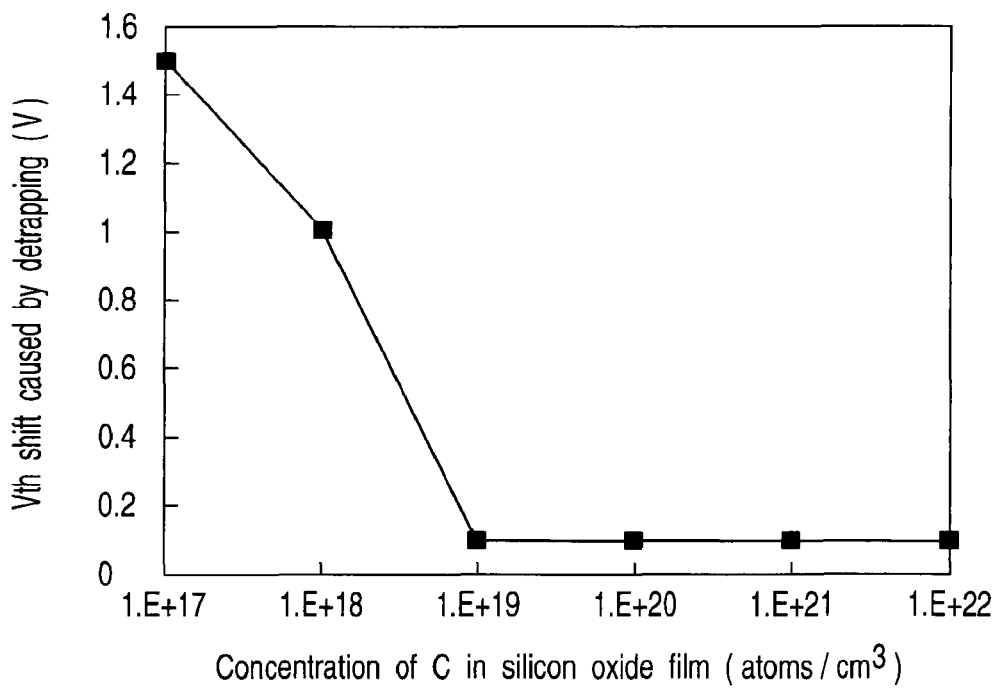
FIG. 26 is a diagram showing the relationship between the concentration of carbon in the silicon oxide film and the amount of variation in threshold (VTh) caused by detrapping in accordance with a ninth embodiment of the present invention.

FIG. 26 is a diagram showing the relationship between the concentration of carbon (C) in the silicon oxide film and a variation in the threshold (Vth) for the memory cell caused by detrapping of charge from the inter-electrode insulating film. The carbon concentration on the axis of abscissa was measured by SIMS. The axis of ordinate indicates the amount of variation in a threshold for a programmed cell after 10 years, the variation being caused by detrapping of charge from the inter-electrode insulating film. As shown in FIG. 26, $1 \times 10^{19}$ atoms/cm$^3$ of carbon in the silicon oxide film enables a trap site in the high dielectric constant insulating film to be terminated with carbon. The variation in threshold can thus be sharply reduced.

Impurities can be doped into the lower silicon oxide film 201 or upper silicon oxide film 203, for example, as described below.

Silicon oxide films are formed by CVD using dichlorosilane and nitrous oxide as source gas at least 700° C. and at most 900° C. This allows desired concentrations of nitrogen and chlorine to be contained in the silicon oxide films 201 and 203. Further, desired concentrations of nitrogen and carbon can be contained in the silicon oxide films 201 and 203 by forming the silicon oxide film by means of ALD using TDMAS and ozone gas as source gas at least 300° C. and at most 700° C. Alternatively, after silicon oxide films are formed by CVD using disilane and oxygen as source gas at least 700° C. and at most 900° C., nitrogen, chlorine, or carbon may be introduced into the silicon oxide films by ion implantation. Alternatively, after silicon oxide films are formed by sputtering in an atmosphere containing oxygen using silicon or a silicon oxide as a target material, nitrogen, chlorine, or carbon may be introduced into the silicon oxide films by ion implantation.

In the description of the present embodiment, the inter-electrode insulating film 20 is formed of the lower silicon oxide film 201, high dielectric constant insulating film 202, and upper silicon oxide film 203, as is the case with the first embodiment. However, the above configuration with doped nitrogen, chlorine, or carbon is applicable to the case where the inter-electrode insulating film 20 is formed of the lower silicon nitride film 204, lower silicon oxide film 201, high dielectric constant insulating film 202, upper silicon oxide film 203, and upper silicon nitride film 205, as is the case with the third embodiment. That is, also in this case, effects similar to those described above can be exerted provided that at least one of the lower silicon oxide film 201 and upper silicon oxide film 203 contains at least one of carbon, nitrogen, and chlorine at a peak concentration of at least $1 \times 10^{19}$ atoms/cm$^3$.

Embodiment 10

A tenth embodiment of the present invention will be described below. The present embodiment relates to a semiconductor device of what is called a MONOS structure (nonvolatile semiconductor memory device). The matters described in the above embodiments will not be described in detail.

Figure 27:
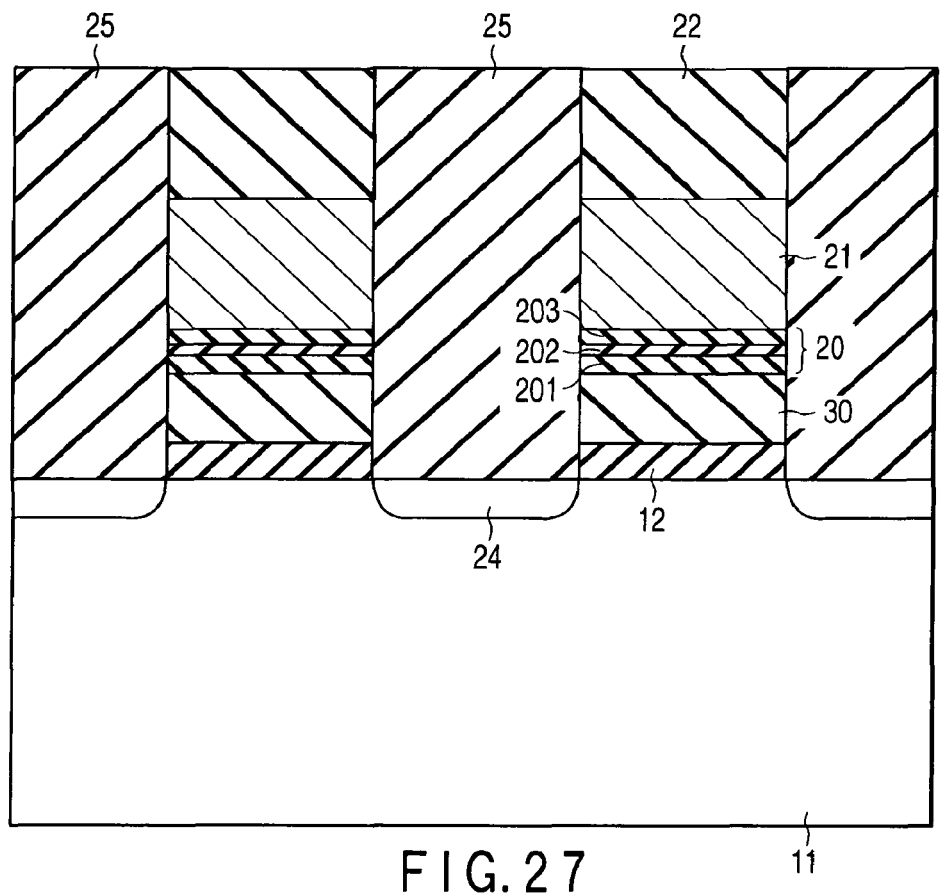
FIG. 27 is a sectional view schematically showing the basic configuration of a semiconductor device in accordance with a tenth embodiment of the present invention.

FIG. 27 is a sectional view showing the basic configuration of a semiconductor device (nonvolatile semiconductor memory device) in accordance with the present embodiment in the bit line direction (channel length direction). The basic configuration and basic manufacturing method in accordance with the present embodiment are similar to those shown in FIGS. 1A and 1B to 5A and 5B. Components corresponding to those shown in FIGS. 1A and 1B to 5A and 5B are denoted by the same reference numerals and will not be described in detail.

The impurity diffusion layer 24 for a source/drain area is provided in a surface area of the silicon substrate (semiconductor substrate) 11. A gate structure is provided on the channel area between the impurity diffusion layers 24; the gate structure has a stack of the tunnel insulating film (first insulating film) 12, charge storage layer 30, upper insulating film (second insulating film) 20, and control gate electrode (control electrode) 21. The upper insulating film 20 is formed of a stack film of the lower silicon oxide film 201, high dielectric constant insulating film (intermediate insulating film) 202, and upper silicon oxide film 203.

When the stack film of the lower silicon oxide film 201, high dielectric constant insulating film (intermediate insulating film) 202, and upper silicon oxide film 203 is used as the upper insulating film 20 provided between the charge storage layer 30 and the control gate electrode 21 as described above, a leakage current generated by applying a high electric field for a programming operation or an erasing operation is reduced, increasing the speed of the element. This also drastically improves the breakdown voltage, providing a sufficient memory operation speed. The use of the stack film also reduces the leakage current of the upper insulating film 20 during the application of a low electric field of at most about 10 MV/cm, offering a sufficient memory retention characteristic. This further sharply reduces the trapped charge and suppresses the emission of the trapped charge, making it possible to avoid memory malfunctions caused by a variation in the threshold for the memory cell.

Forming a stack film including the high dielectric constant insulating film 202 as the upper insulating film 20 enables an increase in physical film thickness without the need to increase electrical film thickness. This makes it possible to reduce the leakage current during the application of a high electric field, while increasing the breakdown voltage. Further, providing the silicon oxide films 201 and 203, having a larger barrier height than the high dielectric constant insulating film 202, enables an effective reduction in the leakage current during the application of a low electric field to the upper insulating film 20 for memory retention or the like. Furthermore, providing the upper silicon oxide film 203 enables the prevention of possible formation of oxygen vacancies in the high dielectric constant insulating film 202 as a result of a reducing atmosphere (for example, a silane (SiH$_4$) gas atmosphere) used to form a control gate electrode 21. A reduction in oxygen vacancies in the high dielectric constant insulating film 202 enables the inhibition of a possible increase in leakage current and a possible decrease in breakdown voltage. Further, providing the silicon oxide films 201 and 203 enables the supply of oxygen to oxygen vacancies produced during the formation of a high dielectric constant insulating film 202 and during the subsequent steps. Thus, the oxygen vacancies can be reduced. Moreover, providing the silicon oxide films 201 and 203 having high barrier height reduces the charge (trapped charge) trapped by the high dielectric constant insulating film 202 during a programming/erasing operation. This also suppresses the emission of the trapped charge toward the control gate electrode 21. This excellent trap characteristic enables a reduction in variation in the threshold for the memory cell.

Description will be given of a method for manufacturing a nonvolatile semiconductor memory device in accordance with the present embodiment.

First, an element formation area and an isolation area are formed in the silicon substrate 11 using an ordinary method. A tunnel insulating film 12 of thickness 2 to 5 nm is subsequently formed on the surface of the silicon substrate 11 by thermal oxidation. A silicon nitride film of thickness 5 to 20 nm is subsequently formed which constitutes the charge storage layer 30. A lower silicon oxide film 201 of thickness about 1 to 5 nm is formed on the surface of the silicon nitride film 30 by CVD. A hafnium aluminate (HfAlO) film as the high dielectric constant insulating film 202 is subsequently formed by ALD on the surface of the lower silicon oxide film 201 to a thickness of between a value equal to the thickness of one atomic layer and about 5 nm. An upper silicon oxide film 203 of thickness about 1 to 5 nm is formed on the surface of the hafnium aluminate film 202 by CVD. A control gate electrode film 21 is subsequently formed on the upper insulating film 20 formed of the lower silicon oxide film 201, high dielectric constant insulating film 202, and upper silicon oxide film 203. Further, a mask film 22 is formed on the control gate electrode film 21 by CVD.

Then, the mask film 22, control gate electrode film 21, upper insulating film 20, charge storage layer 30, and tunnel insulating film 12 are sequentially etched by RIE through a resist mask (not shown). Impurities are subsequently implanted into the silicon substrate 11 by ion implantation to form an impurity diffusion layer 24 for source/drain.

An interlayer insulating film 25 is then formed by CVD or the like. Further, a wiring layer or the like (not shown) is formed using a well-known technique. A nonvolatile semiconductor memory device with a MONOS structure is thus obtained.

With the above manufacturing method, the lower silicon oxide film 201 and upper silicon oxide film 203 are formed by CVD. However, a method such as ALD, sputtering, or a radical process (formation of a lower silicon oxide film) may be used.

Further, with the above manufacturing method, the high dielectric constant insulating film 202 is formed by ALD. However, a method such as CVD or sputtering may be used. The present manufacturing method desirably uses ALD in order to ensure a uniform film thickness and to inhibit a variation in characteristics among the memory cells.

Furthermore, in the present embodiment, the upper insulating film 20 is formed of the lower silicon oxide film 201, high dielectric constant insulating film 202, and upper silicon oxide film 203 as is the case with the first embodiment. However, the structure in accordance with the present embodiment is also applicable to the case where the upper insulating film 20 is formed of the lower silicon nitride film 204, high dielectric constant insulating film 202, and upper silicon nitride film 205 as is the case with the second embodiment. The structure in accordance with the present embodiment is also applicable to the case where the upper insulating film 20 is formed of the lower silicon nitride film 204, lower silicon oxide film 201, high dielectric constant insulating film 202, upper silicon oxide film 203, and upper silicon nitride film 205 as is the case with the third embodiment.

Embodiment 11

An eleventh embodiment of the present invention will be described below. The matters described in the above embodiments will not be described in detail.

FIGS. 34 and 35 are sectional views schematically showing a part of a method for manufacturing a nonvolatile semiconductor memory device in accordance with the present embodiment in the word line direction (channel width direction). Components corresponding to those shown in FIGS. 1A and 1B to 5A and 5B are denoted by the same reference numerals and will not be described in detail.

After the steps shown in FIGS. 3A and 3B, a silicon film 31 of thickness about 0.8 mm is formed by CVD on the exposed surfaces of the polycrystalline silicon film (floating gate electrode film) 13 and the silicon oxide film (isolation insulating film) 17. Specifically, silane (SiH$_4$) gas is used to form a silicon film 31 at 550° C.

Then, as shown in FIG. 35, the silicon film 31 is nitrided to form a silicon nitride film 32. Specifically, a radical nitriding process is executed at 400° C. for 60 seconds in an atmosphere containing nitrogen gas with a partial pressure of 10 Pa. This allows the silicon film 31 to be completely nitrided to form a silicon nitride film 32. Thus, an inter-electrode insulating film 20 formed of the silicon nitride film 32 is obtained. The subsequent steps are similar to those shown in FIGS. 1A and 1B to 5A and 5B.

Thus, in the present embodiment, the silicon film 31 is first formed on the floating gate electrode film 13 and isolation insulating film 17 and then nitrided to form a silicon nitride film 32. This allows a high-quality silicon nitride film 32 to be reliably formed. If a nitriding process was executed without forming a silicon film 31, a high-quality silicon nitride film might be formed on the floating gate electrode film 13 formed of the polycrystalline silicon film but not on the isolation insulating film 17 formed of the silicon oxide film. According to the present embodiment, the silicon film 31 is formed and then nitrided to form a silicon nitride film 32. This enables a high-quality silicon nitride film 32 to be also formed on the isolation insulating film 17.

Further, the ability to form a high-quality silicon nitride film 32 improves the barrier property of the silicon nitride film 32 on the isolation insulating film 17. Thus, a heat treatment in an oxidizing atmosphere during the subsequent step makes it possible to prevent oxidizing gas from entering the isolation insulating film 17. Thus, the oxidizing gas can be inhibited from diffusing to the tunnel insulating film 12 via the isolation insulating film 17. This enables the prevention of possible oxidation of a bird's beak of the tunnel insulating film 12. As a result, the programming/erasing characteristic of the memory cell can be improved. Further, a high-quality silicon nitride film 32 undergoing reduced defects is formed, allowing a reduction in the leakage current flowing between the adjacent memory cells.

Figure 36:
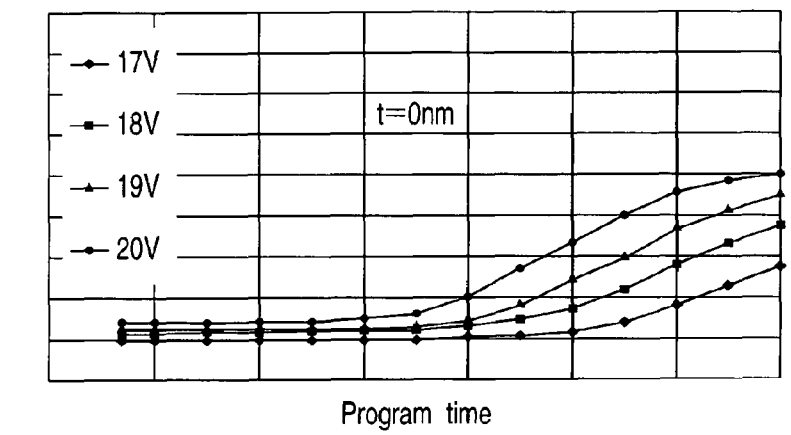
FIGS. 36A, 36B, and 36C are diagrams showing the programming characteristic of memory cells in accordance with the eleventh embodiment of the present invention.
Figure 36:
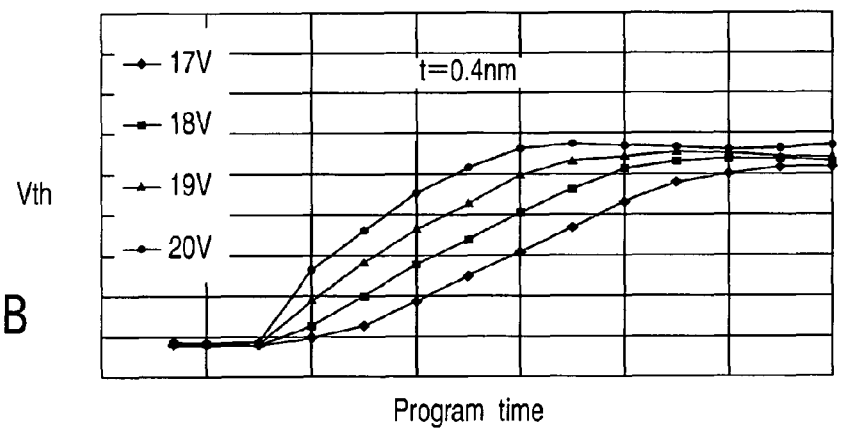
Figure 36:
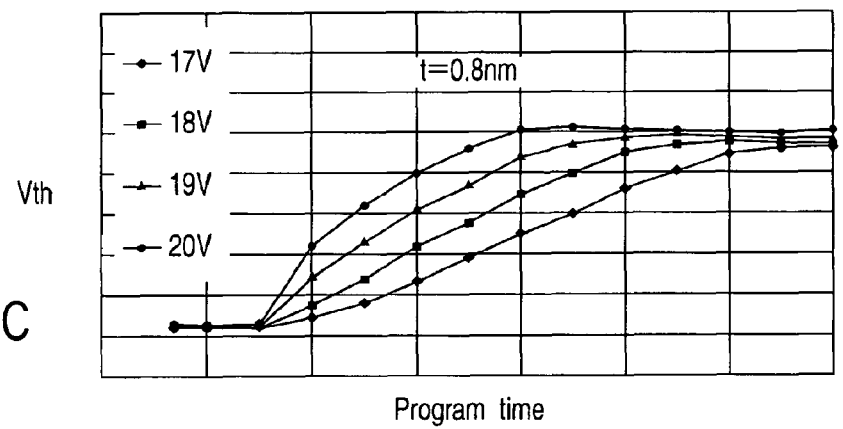

FIGS. 36A, 36B and 36C are diagrams showing the programming characteristic of the memory cell. The axis of abscissa indicates program time. The axis of ordinate indicates the threshold voltage Vth for the memory cell. The programming voltage is 17, 18, 19, or 20V. FIG. 36A shows that the film thickness t of the silicon film 31 is 0 nm (the silicon film 31 is not formed). FIG. 36B shows that the film thickness t of the silicon film 31 is 0.4 nm. FIG. 36C shows that the film thickness t of the silicon film 31 is 0.8 nm. The results shown in FIGS. 36A, 36B, and 36C indicate that the program time decreases and the width of a window for the programming voltage increases, with increasing film thickness t of the silicon film 31. This is because improved oxidation resistance enables the coupling ratio of the memory cell to be optimized. Therefore, setting the film thickness of the silicon film 31 at about 0.8 nm provides a high-quality silicon nitride film 32 with an improved barrier property.

In the present embodiment, the inter-electrode insulating film 20 may have a single layer structure formed of the silicon nitride film 32 or such a stack structure as shown in the second and third embodiments. That is, the inter-electrode insulating film 20 may be formed of the lower silicon nitride film 204, high dielectric constant insulating film (intermediate insulating film) 202, and upper silicon nitride film 205 as shown in FIGS. 14A and 14B for the second embodiment. Alternatively, the inter-electrode insulating film 20 may be formed of the lower silicon nitride film 204, lower silicon oxide film 201, high dielectric constant insulating film (intermediate insulating film) 202, upper silicon oxide film 203, and upper silicon nitride film 205 as shown in FIGS. 16A and 16B for the third embodiment. In any case, the method in accordance with the present embodiment is applicable to the formation of a lower silicon nitride film 204.

Embodiment 12

A twelfth embodiment of the present invention will be described below. The matters described in the above embodiments will not be described in detail.

FIG. 37 is a sectional view schematically showing a part of a method for manufacturing a nonvolatile semiconductor memory device in accordance with the present embodiment in the word line direction (channel width direction). Components corresponding to those shown in FIGS. 1A and 1B to 5A and 5B are denoted by the same reference numerals and will not be described in detail.

After the steps shown in FIGS. 3A and 3B, a silicon nitride film 32 is formed by ALD on the exposed surfaces of the polycrystalline silicon film (floating gate electrode film) 13 and the silicon oxide film (isolation insulating film) 17. Specifically, dichlorosilane is used as a silicon source, and an ammonia radical is used as a nitriding agent. The film formation temperature is set at about 450° C. During the formation of a silicon nitride film by ALD, the step of forming a silicon layer and the step of nitriding the silicon layer are repeated a number of times. The method in accordance with the present embodiment first executes the step of forming a silicon layer.

Thus, in the present embodiment, to form a silicon nitride film 32 by ALD, a silicon layer is first formed on the floating gate electrode film 13 and isolation insulating film 17 and then nitrided. This allows a high-quality silicon nitride film 32 to be reliably formed on the floating gate electrode film 13 and isolation insulating film 17 as is the case with the eleventh embodiment.

Further, the pre-formation of a silicon layer makes it possible to prevent ammonia, a nitriding agent, from entering the isolation insulating film 17. This enables the prevention of possible degradation of the tunnel insulating film 12, providing memory cells with excellent characteristics.

FIG. 38 is a diagram showing the relationship between the film formation temperature of the silicon nitride film 32 and the concentration of hydrogen in the isolation insulating film 17. FIG. 39 is a diagram showing the relationship between the film formation temperature of the silicon nitride film 32 and a leakage current generated by applying an electric field of 5 MV/cm to the inter-electrode insulating film. FIG. 38 shows that a film formation temperature of higher than about 450° C. increases the concentration of hydrogen in the isolation insulating film 17. FIG. 39 shows that a film formation temperature of lower than about 350° C. increases the magnitude of the leakage current. Therefore, the film formation temperature of the silicon nitride film 32 is preferably between 350° C. and 450° C.

The present embodiment uses the ammonia radical as a nitriding agent. However, a nitrogen radical may also be used. Also in this case, the pre-formation of a silicon layer prevents the surface of the isolation insulating film 17 from being exposed directly to the nitrogen radical. This enables a reduction in the leakage current flowing between the adjacent memory cells.

In the present embodiment, the inter-electrode insulating film 20 may have a single layer structure formed of the silicon nitride film 32 or such a stack structure as shown in the second and third embodiments. That is, the inter-electrode insulating film 20 may be formed of the lower silicon nitride film 204, high dielectric constant insulating film (intermediate insulating film) 202, and upper silicon nitride film 205 as shown in FIGS. 14A and 14B for the second embodiment. Alternatively, the inter-electrode insulating film 20 may be formed of the lower silicon nitride film 204, lower silicon oxide film 201, high dielectric constant insulating film (intermediate insulating film) 202, upper silicon oxide film 203, and upper silicon nitride film 205 as shown in FIGS. 16A and 16B for the third embodiment. In any case, the method in accordance with the present embodiment is applicable to the formation of a lower silicon nitride film 204.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
a semiconductor substrate;
a first insulating film formed on the semiconductor substrate;
a charge storage layer formed on the first insulating film;
a second insulating film formed on the charge storage layer; and
a control electrode formed on the second insulating film,
the second insulating film having one of a first film structure and a second film structure,
the first film structure including a lower silicon oxide film, an intermediate insulating film formed on the lower silicon oxide film and containing a metal element, the intermediate insulating film having a relative dielectric constant of greater than 7, and an upper silicon oxide film formed on the intermediate insulating film,
the second film structure including a lower silicon nitride film, a lower silicon oxide film formed on the lower silicon nitride film, an intermediate insulating film formed on the lower silicon oxide film and containing a metal element, the intermediate insulating film having a relative dielectric constant of greater than 7, an upper silicon oxide film formed on the intermediate insulating film, and an upper silicon nitride film formed on the upper silicon oxide film,
the intermediate insulating film having a carbon concentration of at least $1 \times 10^{19}$ atoms/cm$^3$ and at most $2 \times 10^{22}$ atoms/cm$^3$, and
at least one of the lower silicon oxide film and the upper silicon oxide film contains an impurity element selected from carbon, nitrogen, and chlorine at a peak dopant concentration of at least $1 \times 10^{19}$ atoms/cm$^3$.

2. The semiconductor device according to claim 1, wherein the intermedia:e insulating film is formed of a polycrystalline film, and crystal grains contained in the polycrystalline film have an average grain size of at least 5 nm.

3. The semiconductor device according to claim 1, wherein the following expressing is satisfied, $$T/(T+M+S) \geq 0.2$$

where T (T>0) is a concentration of a transition metal element in the intermediate insulating film, M (M>0) is a concentration of a metal element other than the transition metal element in the intermediate insulating film, and S (S>0) is a concentration of a semiconductor element in the intermediate insulating film.

4. The semiconductor device according to claim 1, wherein at least one of the lower silicon oxide film and the upper silicon oxide film is thicker than the intermediate insulating film.

5. The semiconductor device according to claim 1, wherein the impurity element contained in at least one of the lower silicon oxide film and the upper silicon oxide film is the same as that contained in the intermediate insulating film.

* * * * *

UNITED STATES PATENT AND TRADEMARK OFFICE
CERTIFICATE OF CORRECTION

PATENT NO. : 8,110,865 B2  
APPLICATION NO. : 12/888140  
DATED : February 7, 2012  
INVENTOR(S) : Tanaka et al.

It is certified that error appears in the above-identified patent and that said Letters Patent is hereby corrected as shown below:

Claim 3, column 38, line 62, change "expressing" to --expression--.

Claim 3, column 38, line 66, change "(M>0)" to --(M≥0)--.

Claim 3, column 39, line 1, change "(S>0)" to --(S≥0)--.

Signed and Sealed this  
Fifteenth Day of May, 2012

David J. Kappos  
*Director of the United States Patent and Trademark Office*